(12) United States Patent
Lin et al.

(10) Patent No.: US 9,548,282 B2
(45) Date of Patent: Jan. 17, 2017

(54) METAL CONTACT FOR SEMICONDUCTOR DEVICE

(71) Applicant: NANTONG FUJITSU MICROELECTRONICS CO., LTD., Nantong, Jiangsu (CN)

(72) Inventors: Chang-Ming Lin, Jiangsu (CN); Lei Shi, Jiangsu (CN); Yujuan Tao, Jiangsu (CN)

(73) Assignee: NANTONG FUJITSU MICROELECTRONICS CO., LTD., Nantong, Jiangsu (CN)

( * ) Notice: Subject to any disclaimer, the term of this patent is extended or adjusted under 35 U.S.C. 154(b) by 0 days.

(21) Appl. No.: 14/440,872

(22) PCT Filed: Oct. 30, 2013

(86) PCT No.: PCT/CN2013/086214
§ 371 (c)(1),
(2) Date: May 5, 2015

(87) PCT Pub. No.: WO2014/071815
PCT Pub. Date: May 15, 2014

(65) Prior Publication Data
US 2015/0287688 A1 Oct. 8, 2015

(30) Foreign Application Priority Data

Nov. 8, 2012 (CN) .......................... 2012 1 0444471
Nov. 8, 2012 (CN) .......................... 2012 1 0444474

(51) Int. Cl.
*H01L 23/00* (2006.01)
*H01L 23/31* (2006.01)

(52) U.S. Cl.
CPC ........... *H01L 24/13* (2013.01); *H01L 23/3171* (2013.01); *H01L 24/03* (2013.01); *H01L 24/05* (2013.01);
(Continued)

(58) Field of Classification Search
CPC ................... H01L 24/13; H01L 24/05; H01L 2225/06513; H01L 24/81; H01L 24/16; H01L 2224/16
See application file for complete search history.

(56) References Cited

U.S. PATENT DOCUMENTS 6,518,651 B2  2/2003  Hashimoto
7,417,311 B2  8/2008  Yamano
(Continued)

FOREIGN PATENT DOCUMENTS

CN  1392607 A  1/2003
CN  1630029 A  6/2005
(Continued)

OTHER PUBLICATIONS

International Search Report in Chinese Language issued by the State Intellectual Property Office of the P.R. China, dated Jan. 6, 2014, for International Application No. PCT/CN2013/086210; 4 pages.

(Continued)

*Primary Examiner* — Ngan Ngo
(74) *Attorney, Agent, or Firm* — RatnerPrestia

(57) ABSTRACT

A semiconductor device and a manufacturing method thereof. The semiconductor device includes a semiconductor substrate (300) provided with a plurality of pads (301), columnar electrodes on the pads (301) and a solder ball (321) provided on the columnar electrode. The columnar electrode comprises a main body (307) and a groove in the main body (307), and an opening of the groove is overlapped (Continued)

with the top surface of the columnar electrode. The solder ball (321) comprises a metal bump (320) arranged on the top of the columnar electrode and a filling part (319) filled in the groove. The solder ball and the columnar electrode form a structure similar to a bolt; thus the binding force between the solder ball and the columnar electrode is improved.

6 Claims, 14 Drawing Sheets

(52) U.S. Cl.
CPC .............. *H01L 24/11* (2013.01); *H01L 24/16* (2013.01); *H01L 23/3114* (2013.01); *H01L 23/3192* (2013.01); *H01L 24/81* (2013.01); *H01L 2224/0345* (2013.01); *H01L 2224/03462* (2013.01); *H01L 2224/03472* (2013.01); *H01L 2224/0401* (2013.01); *H01L 2224/05008* (2013.01); *H01L 2224/05011* (2013.01); *H01L 2224/05548* (2013.01); *H01L 2224/05562* (2013.01); *H01L 2224/05567* (2013.01); *H01L 2224/05571* (2013.01); *H01L 2224/05572* (2013.01); *H01L 2224/05655* (2013.01); *H01L 2224/115* (2013.01); *H01L 2224/1132* (2013.01); *H01L 2224/11462* (2013.01); *H01L 2224/11849* (2013.01); *H01L 2224/13006* (2013.01); *H01L 2224/13011* (2013.01); *H01L 2224/13014* (2013.01); *H01L 2224/13015* (2013.01); *H01L 2224/13016* (2013.01); *H01L 2224/13018* (2013.01); *H01L 2224/13023* (2013.01); *H01L 2224/13076* (2013.01); *H01L 2224/13111* (2013.01); *H01L 2224/13147* (2013.01); *H01L 2224/16* (2013.01); *H01L 2225/06513* (2013.01)

(56) References Cited

U.S. PATENT DOCUMENTS

| | | | |
|---|---|---|---|
| 7,713,860 B2 | 5/2010 | Yu | |
| 7,728,431 B2 | 6/2010 | Harada et al. | |
| 7,932,601 B2 | 4/2011 | Chang et al. | |
| 8,022,530 B2 | 9/2011 | Shih | |
| 8,492,263 B2 | 7/2013 | Wang et al. | |
| 8,492,891 B2 | 7/2013 | Lu et al. | |
| 9,018,758 B2 | 4/2015 | Hwang et al. | |
| 2002/0056741 A1 | 5/2002 | Shieh et al. | |
| 2002/0125569 A1 | 9/2002 | Fukuda et al. | |
| 2003/0234447 A1* | 12/2003 | Yunus ............... | H01L 23/49816 257/739 |
| 2005/0167780 A1* | 8/2005 | Edelstein ............ | H01L 23/5227 257/531 |
| 2006/0237855 A1* | 10/2006 | Kroehnert ......... | H01L 23/49816 257/779 |
| 2007/0048896 A1* | 3/2007 | Andry ................ | H01L 21/4853 438/106 |
| 2007/0085182 A1 | 4/2007 | Yamaguchi | |
| 2008/0048337 A1 | 2/2008 | Takahashi et al. | |
| 2008/0128904 A1* | 6/2008 | Sakamoto ............ | H01L 21/563 257/737 |
| 2008/0191357 A1* | 8/2008 | Kouno ................. | H01L 24/03 257/762 |
| 2008/0194095 A1* | 8/2008 | Daubenspeck ..... | H01L 23/3192 438/612 |
| 2008/0224308 A1* | 9/2008 | Lee ......................... | H01L 24/11 257/737 |
| 2009/0072393 A1* | 3/2009 | Bachman ............... | H01L 24/03 257/737 |
| 2009/0098723 A1 | 4/2009 | Yu | |
| 2009/0110881 A1* | 4/2009 | Daubenspeck ....... | H01L 21/563 428/138 |
| 2009/0200675 A1* | 8/2009 | Goebel ................. | H01L 24/10 257/758 |
| 2009/0256257 A1* | 10/2009 | Daubenspeck ... | H01L 23/53295 257/738 |
| 2009/0309216 A1 | 12/2009 | Jeon | |
| 2010/0187690 A1 | 7/2010 | Okada et al. | |
| 2010/0230811 A1 | 9/2010 | Shin et al. | |
| 2010/0289092 A1* | 11/2010 | Perng ...................... | H01L 29/78 257/401 |
| 2011/0101527 A1* | 5/2011 | Cheng ..................... | H01L 24/11 257/738 |
| 2011/0115073 A1* | 5/2011 | Chen ....................... | H01L 24/05 257/737 |
| 2011/0133333 A1* | 6/2011 | Kwon ............... | H01L 21/76898 257/737 |
| 2011/0140126 A1* | 6/2011 | Gaul .................... | H01L 23/3677 257/77 |
| 2011/0266670 A1* | 11/2011 | England ................ | H01L 23/562 257/738 |
| 2011/0310579 A1* | 12/2011 | Smeys ................. | H01F 17/0013 361/782 |
| 2012/0006591 A1* | 1/2012 | Kaneko ............... | H01L 21/4857 174/262 |
| 2012/0006592 A1 | 1/2012 | Ouchi | |
| 2012/0086124 A1 | 4/2012 | Yamaguchi | |
| 2012/0261813 A1* | 10/2012 | Anderson ............... | H01L 24/11 257/737 |
| 2013/0026618 A1* | 1/2013 | Chen ..................... | H01L 23/525 257/737 |
| 2013/0026622 A1* | 1/2013 | Chuang .................. | H01L 24/11 257/737 |
| 2013/0049195 A1* | 2/2013 | Wu ......................... | H01L 24/97 257/738 |
| 2013/0113097 A1* | 5/2013 | Yu .......................... | H01L 24/14 257/738 |
| 2013/0119534 A1* | 5/2013 | Daubenspeck ........ | H01L 23/562 257/737 |
| 2013/0207260 A1* | 8/2013 | Hsu ......................... | H01L 23/48 257/738 |
| 2013/0234315 A1* | 9/2013 | Daubenspeck ......... | H01L 22/12 257/737 |
| 2013/0277829 A1* | 10/2013 | Yee ................... | H01L 23/49827 257/737 |
| 2013/0292817 A1* | 11/2013 | LaCroix .................. | H01L 22/34 257/737 |
| 2014/0015122 A1* | 1/2014 | Chou ..................... | H01L 23/525 257/737 |
| 2014/0042633 A1* | 2/2014 | Hong ...................... | H01L 24/03 257/773 |
| 2014/0048926 A1* | 2/2014 | Wang ................... | H01L 23/3178 257/737 |
| 2014/0061924 A1* | 3/2014 | Chen ...................... | H01L 23/481 257/758 |
| 2014/0077374 A1* | 3/2014 | Lin ........................ | H01L 23/481 257/741 |
| 2014/0124897 A1* | 5/2014 | Motoyama .............. | H01L 23/66 257/617 |
| 2014/0252608 A1* | 9/2014 | Chen ................... | H01L 21/4846 257/738 |
| 2015/0021759 A1* | 1/2015 | Chen ....................... | H01L 24/14 257/737 |
| 2015/0206837 A1* | 7/2015 | Gu ....................... | H01L 23/5389 257/531 |
| 2015/0206846 A1* | 7/2015 | Lo ........................... | H01L 24/05 257/737 |
| 2015/0214127 A1* | 7/2015 | Gu ........................ | H01L 23/367 257/712 |
| 2015/0235940 A1* | 8/2015 | Chen ..................... | H01L 23/528 257/759 |

FOREIGN PATENT DOCUMENTS

| | | |
|---|---|---|
| CN | 101136383 A | 3/2008 |
| CN | 101154640 A | 4/2008 |

(56) References Cited

FOREIGN PATENT DOCUMENTS

| | | |
|---|---|---|
| CN | 101211791 A | 7/2008 |
| CN | 101315915 A | 12/2008 |
| CN | 101436559 A | 5/2009 |
| CN | 101728347 A | 6/2010 |
| CN | 102237316 A | 11/2011 |
| CN | 102270590 A | 12/2011 |
| CN | 102270610 A | 12/2011 |
| CN | 102437065 A | 5/2012 |
| CN | 102437066 A | 5/2012 |
| CN | 102496580 A | 6/2012 |
| CN | 102664174 A | 9/2012 |
| CN | 102915982 | 2/2013 |
| CN | 102915985 A | 2/2013 |
| CN | 102931098 A | 2/2013 |
| CN | 102931099 A | 2/2013 |
| CN | 102931101 A | 2/2013 |
| CN | 102931110 A | 2/2013 |
| CN | 102931158 A | 2/2013 |
| CN | 102931164 A | 2/2013 |
| CN | 202917475 U | 5/2013 |
| CN | 202917476 U | 5/2013 |
| CN | 202917483 U | 5/2013 |
| CN | 203013710 U | 6/2013 |
| JP | 2004247522 A | 9/2004 |
| JP | 2005136035 A | 5/2005 |
| JP | 2005286087 A | 10/2005 |
| JP | 2006229018 A | 8/2006 |
| JP | 2009224581 A | 10/2009 |
| JP | 201077456 A | 8/2010 |
| JP | 2012054297 A | 3/2012 |
| KR | 20110017153 A | 2/2011 |

OTHER PUBLICATIONS

International Search Report in English Language issued by the State Intellectual Property Office of the P.R. China, dated Jan. 6, 2014, for International Application No. PCT/CN2013/086210; 3 pages.

International Search Report and Written Opinion, in Chinese Language, issued by the State Intellectual Property Office of the P.R. China, dated Jan. 26, 2014, for International Application No. PCT/CN2013/086214; 11 pages.

International Search Report, in English Language, issued by the State Intellectual Property Office of the P.R. China, dated Jan. 26, 2014, for International Application No. PCT/CN2013/086214; 4 pages.

International Search Report and Written Opinion in Chinese Language, issued by the State Intellectual Property Office of the P.R. China, dated Jan. 8, 2014, for International Application No. PCT/CN2013/086211; 10 pages.

International Search Report in English Language, issued by the State Intellectual Property Office of the P.R. China, dated Jan. 8, 2014, for International Application No. PCT/CN2013/086211; 3 pages.

Notice of Allowance for U.S. Appl. No. 14/441,477 dated Dec. 18, 2015.

Non Final Office Action for U.S. Appl. No. 14/440,876 dated Dec. 31, 2015.

* cited by examiner

METAL CONTACT FOR SEMICONDUCTOR DEVICE

CROSS-REFERENCE TO RELATED APPLICATIONS

The present application is a Section 371 National Stage application of International Application No. PCT/CN2013/086214, filed on Oct. 30, 2013, which claims priority to Chinese patent application No. 201210444471.2, filed on Nov. 8, 2012, and entitled "SEMICONDUCTOR DEVICE", Chinese patent application No. 201210444474.6, filed on Nov. 8, 2012, and entitled "METHOD FOR FORMING SEMICONDUCTOR DEVICE", and the entire disclosures of which are incorporated herein by reference.

FIELD OF THE DISCLOSURE

The present disclosure generally relates to semiconductor packaging field, and more particularly, to a semiconductor device, which can improve a binding force between a solder ball and a columnar electrode, and a forming method thereof.

BACKGROUND OF THE DISCLOSURE

Chip Scale Package (CSP) is one of the latest developed chip package technologies. Products obtained by CSP generally have advantages such as small sizes, good electrical and thermal properties. Wafer-level CSP (WCSP) technology, one of the CSP technologies, includes following processes: packaging a wafer; performing a burn-in test to the wafer; removing unqualified portions; and dicing the wafer into a plurality of single CSP circuits.

A semiconductor device having a wafer-level CSP structure is disclosed in a Chinese patent publication No. CN1630029A. Referring to FIG. 1, the semiconductor device includes a semiconductor substrate 11 having a pad 12 formed thereon; a passivation layer 14 on the semiconductor substrate 11; an opening in the passivation layer 14 exposing the pad 12; a redistribution layer 16 formed on a portion of the passivation layer 14 and in the opening and being connected with the pad 12; a columnar electrode 17 on a portion of the redistribution layer 16 outside the opening region; an insulating layer 20 covering the redistribution layer 16 and a portion of the passivation layer 14, wherein a surface of the insulating layer 20 is flush with a surface of the columnar electrode 17; and a solder ball 21 on the columnar electrode 17.

However, in conventional semiconductor devices, a solder wall is prone to fall off a columnar electrode.

SUMMARY

Embodiments of the present disclosure provide a semiconductor device and a method for forming the same, which may improve a bonding force between a solder ball and a columnar electrode.

In an embodiment, a semiconductor device is provided, including: a semiconductor substrate with a pad formed therein; a columnar electrode formed above the pad, the columnar electrode including a main body and at least one groove in the main body, wherein an opening of the at least one groove is overlapped with a top surface of the columnar electrode; and a solder ball formed on the columnar electrode, the solder ball including a metal bump formed on the top surface of the columnar electrode and a filling part filled in the at least one groove.

In some embodiments, one groove may be formed in the columnar electrode with a diameter being 1% to 99% of a diameter of the main body of the column electrode.

In some embodiments, more than one groove may be formed in the columnar electrode and distributed in the main body of the columnar electrode independently.

In some embodiments, the more than one groove may be distributed in the main body in straight line, in matrix, in concentric circle, in concentric ring, in polygon, or irregularly.

In some embodiments, the semiconductor device may further include a passivation layer formed on the semiconductor substrate, and a first opening formed in the passivation layer, where the first opening exposes a portion of or the whole top surface of the pad, and a sidewall of the first opening contacts with a sidewall of the columnar electrode.

In some embodiments, the semiconductor device may further include a first insulating layer formed on the passivation layer, wherein a top surface of the first insulating layer is flush with the top surface of the columnar electrode, and the first insulating layer covers the sidewall of the columnar electrode.

In some embodiments, the semiconductor device may further include a first insulating layer formed on the passivation layer, wherein a top surface of the first insulating layer is lower than the top surface of the columnar electrode, and a first annular groove is formed between the first insulating layer and the columnar electrode, and exposes a portion of the passivation layer.

In some embodiments, the solder ball may further include a margin part surrounding the sidewall of the columnar electrode, wherein an upper portion of the margin part is connected with the metal bump, a lower portion of the margin part is disposed in the first annular groove and contacts with a portion of the passivation layer beside the columnar electrode, the lower portion is wider than the upper portion, and a surface of the lower portion is lower than, flush with or higher than the top surface of the first insulating layer.

In some embodiments, the semiconductor device may further include: a passivation layer formed on the semiconductor substrate; a first opening formed in the passivation layer and exposing at least a portion of a surface of the pad; and a redistribution layer formed on a portion of the passivation layer, wherein the redistribution layer fills the first opening and serves as an extended part of the pad, and the columnar electrode is disposed on the redistribution layer outside the first opening.

In some embodiments, the semiconductor device may further include a second insulating layer covering the passivation layer and the redistribution layer, wherein a surface of the second insulating layer is flush with the top surface of the columnar electrode.

In some embodiments, the semiconductor device may further include a second insulating layer formed on the passivation layer, wherein a top surface of the second insulating layer is lower than the top surface of the columnar electrode, and a second annular groove is formed between the second insulating layer and the columnar electrode, and exposes a portion of a surface of the redistribution layer.

In some embodiments, the solder ball may further include a margin part surrounding the sidewall of the columnar electrode, wherein an upper portion of the margin part is connected with the metal bump, a lower portion of the margin part is disposed in the second annular groove and contacts with a portion of the redistribution layer beside the columnar electrode, the lower portion is wider than the upper portion, and a surface of the lower portion is lower than, flush with or higher than the top surface of the first insulating layer.

In some embodiments, the semiconductor device may further include a metal resist layer between the solder ball and the main body of the columnar electrode.

In an embodiment, a method for forming a semiconductor device is provided, including: providing a semiconductor substrate with a pad formed therein; forming a passivation layer on the semiconductor substrate, the passivation layer having a first opening which exposes the pad; forming a columnar electrode above the pad, wherein the columnar electrode includes a main body and at least one groove in the main body, and an opening of the at least one groove is overlapped with a top surface of the columnar electrode; and forming a solder ball on the columnar electrode, the solder ball including a metal bump formed on the top surface of the columnar electrode and a filling part filled in the at least one groove.

In some embodiments, one groove may be formed in the columnar electrode with a diameter being 1% to 99% of a diameter of the main body of the column electrode.

In some embodiments, more than one groove may be formed in the columnar electrode and distributed in the main body of the columnar electrode independently.

In some embodiments, the more than one groove may be distributed in the main body in straight line, in matrix, in concentric circle, in concentric ring, in polygon, or irregularly.

In some embodiments, forming the columnar electrode above the pad may include: forming a seed layer on sidewalls and the bottom of the first opening, and on a surface of the passivation layer; forming a first photoresist layer on the seed layer, wherein the first photoresist layer has a second opening which corresponds to the first opening; filling a metal into the first and second openings using an electroplating process, to form a main body of the columnar electrode; removing the first photoresist layer; removing a portion of the seed layer on the passivation layer with the main body as a mask; forming a first insulating layer on the passivation layer; forming a second photoresist layer on the first insulating layer and on the main body of the columnar electrode, wherein the second photoresist layer has at least one third opening which exposes a top surface of the main body of the columnar electrode; and removing a portion of the main body of the columnar electrode by etching along the at least one third opening, to form the at least one groove in the main body, wherein the main body and the at least one groove in the main body constitute the columnar electrode.

In some embodiments, a top surface of the first insulating layer may be flush with the top surface of the main body, and the first insulating layer may contact with a sidewall of the columnar electrode.

In some embodiments, the method may further include: after the at least one groove is formed in the main body, removing the second photoresist layer; disposing a printing screen or a stainless screen on the first insulating layer, wherein the printing screen or the stainless screen has a fourth opening which exposes the main body and the at least one groove of the columnar electrode; filling a soldering paste into the fourth opening and the at least one groove by a screen printing process; removing the printing screen or stainless screen; and performing a reflow process on the soldering paste to form the metal bump on the main body of the columnar electrode and the filling part in the at least one groove in the columnar electrode, wherein the metal bump and the filling part constitute the solder ball.

In some embodiments, the top surface of the first insulating layer may be lower than the top surface of the main body of the columnar electrode, and a first annular groove may be formed between the first insulating layer and the columnar electrode, and exposes a portion of the surface of the passivation layer.

In some embodiments, the method may further include: after the at least one groove is formed in the main body, removing the second photoresist layer; disposing a printing screen or a stainless screen on the first insulating layer, wherein the printing screen or the stainless screen has a fourth opening which exposes the top surface of the main body, the at least one groove of the columnar electrode and the first annular groove; filling a soldering paste into the fifth opening, the at least one groove and the first annular groove by a screen printing process; removing the printing screen or stainless screen; and performing a reflow process on the soldering paste to form the metal bump on the main body of the columnar electrode, the filling part in the at least one groove in the columnar electrode, and a margin part surrounding the sidewall of the main body of the columnar electrode, wherein an upper portion of the margin part is connected with the metal bump, a lower portion of the margin part is disposed in the first annular groove and contacts with a portion of the passivation layer beside the columnar electrode, the lower portion is wider than the upper portion, a surface of the lower portion is lower than, flush with or higher than the surface of the first insulating layer, and the metal bump, the filling part and the margin part constitute the solder ball.

In some embodiments, the method may further include: forming a metal resist layer between the solder wall and the main body of the columnar electrode.

Compared with the conventional methods, the present disclosure has following advantages.

In the semiconductor devices provided in embodiments of the present disclosure, the columnar electrode include the main body and the at least one groove in the main body, the opening of the at least one groove is overlapped with the top surface of the columnar electrode, and the solder ball is formed on the columnar electrode and includes the metal bump on the top surface of the columnar electrode and the filling part filled in the grooves. In exiting techniques, the solder ball and the columnar electrode are connected with each other at a single plane. However, in the present disclosure, the solder ball and the columnar electrode constitute a bolt like structure. The solder ball and the columnar electrode are connected with each other at multiple planes, that is, the solder ball not only contacts with the top surface of the columnar electrode but also contacts with the inner of the columnar electrode. Thus, a contact area between the solder ball and the columnar electrode is increased, and a bonding force between them is improved, which prevents the solder ball from falling off the columnar electrode. Besides, the at least one groove is only disposed in the main body, which does not affect the bonding between the bottom of the main body and the pad.

In some embodiments, there is one groove in the main body, and the diameter of the groove is 1% to 99% of the diameter of the main body. Accordingly, there is one filling part in the solder ball, and the diameter of the filling part is 1% to 99% of the diameter of the main body. A contact area between the filling part and the main body is increased while the mechanical strength of the sidewall of the main body is maintained at a certain level, thus, the bonding between the solder ball and the columnar electrode is strengthened, which prevents the solder ball from falling off the columnar electrode.

In some embodiments, there is more than one groove in the main body, which is distributed in the main body independently, for example, in straight line, in matrix, in concentric circle, in concentric ring, in polygon, or irregularly. The number and position of the filling parts of the solder ball correspond to the number and position of the grooves in the columnar electrode, which increases the number of contact planes between the solder ball and the columnar electrode and thus increases the contact area. Therefore, the bonding between the solder ball and the columnar electrode can be further increased. The more than one filling part is distributed in the main body regularly, which makes the bonding force between the solder ball and the columnar electrode be distributed evenly in each direction.

In some embodiments, the solder ball further includes the margin part surrounding the main body of the columnar electrode. The solder ball not only contacts with the top surface of the main body and the inner sidewall of the groove in the main body, but also contacts with the sidewall of the main body, which increases the number of contact planes and a contact area between the solder ball and the columnar electrode. When an external force is applied to the solder ball, the external force may be diffused, thus the structure of the solder ball and the main body can enhance the bonding between the solder ball and the columnar electrode.

In some embodiments, the depth of the grooves is 0.5% to 99.9% of the height of the main body, that is, the filling part stretches into the main body a certain depth, which strengthens the bonding of a bolt like structure constituted by the solder ball and the columnar electrode.

From the opening to the bottom of the groove, the groove becomes narrower gradually. In this way, gaps are hardly generated when the soldering paste is filled into the groove, which further strengthens the connection between the solder ball and the columnar electrode.

DETAILED DESCRIPTION OF THE DISCLOSURE

Figure 1:
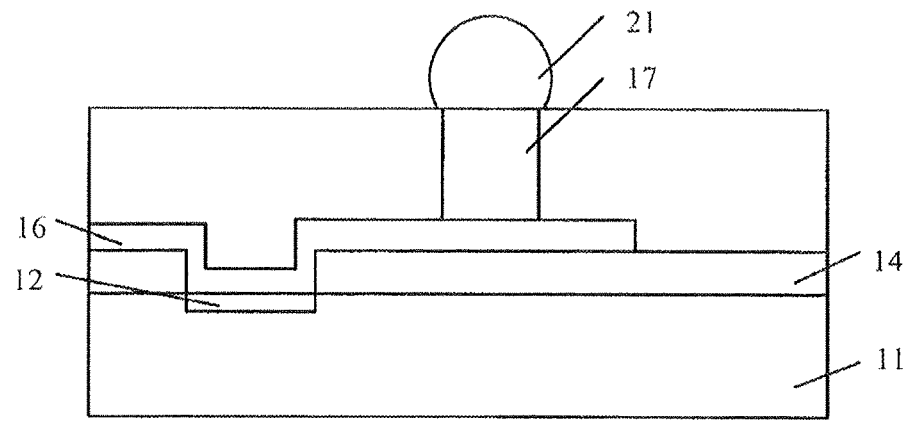
FIG. 1 schematically illustrates a structural diagram of a semiconductor device with a wafer-level structure in existing techniques.

In existing semiconductor devices of a wafer-level CSP structure, a solder ball generally only contacts with a top surface of a columnar electrode, thus, a contact area is relatively small, and the bonding strength between the solder ball and the columnar electrode is relatively weak. When an external force is applied to the solder ball, the solder ball is prone to fall off the columnar electrode, or cracks may be generated on a contact plane between the solder ball and the columnar electrode. As a result, a subsequent packaging process may be affected and a packaged device formed in this way may be invalid.

In embodiments of present disclosure, a semiconductor device is provided. A columnar electrode in the semiconductor device includes a main body and at least one groove in the main body, and an opening of the groove is overlapped with a top surface of the columnar electrode. A solder ball formed on the columnar electrode includes a metal bump formed on the top surface of the columnar electrode and a filling part filled in the at least one groove. The solder ball and the columnar electrode constitute a bolt like structure. The solder ball and the columnar electrode are connected with each other at multiple planes other than a single plane in the existing techniques. That is, the solder ball not only contacts with the top surface of the columnar electrode but also contacts with the inner of the columnar electrode. Thus, a contact area between the solder ball and the columnar electrode is increased, and a bonding force between them is improved, which prevents the solder ball from falling off the columnar electrode. Besides, the groove is only disposed in the main body, which does not affect the bonding between the bottom of the main body and a pad.

In order to clarify the objects, characteristics and advantages of the disclosure, embodiments of present disclosure will be described in detail in conjunction with accompanying drawings. For convenience, elements in the drawings are not necessarily drawn to scale and the drawings as examples are not meant to limit the present disclosure. In practice, three-dimensional sizes including length, width and depth should be considered.

Figure 2:
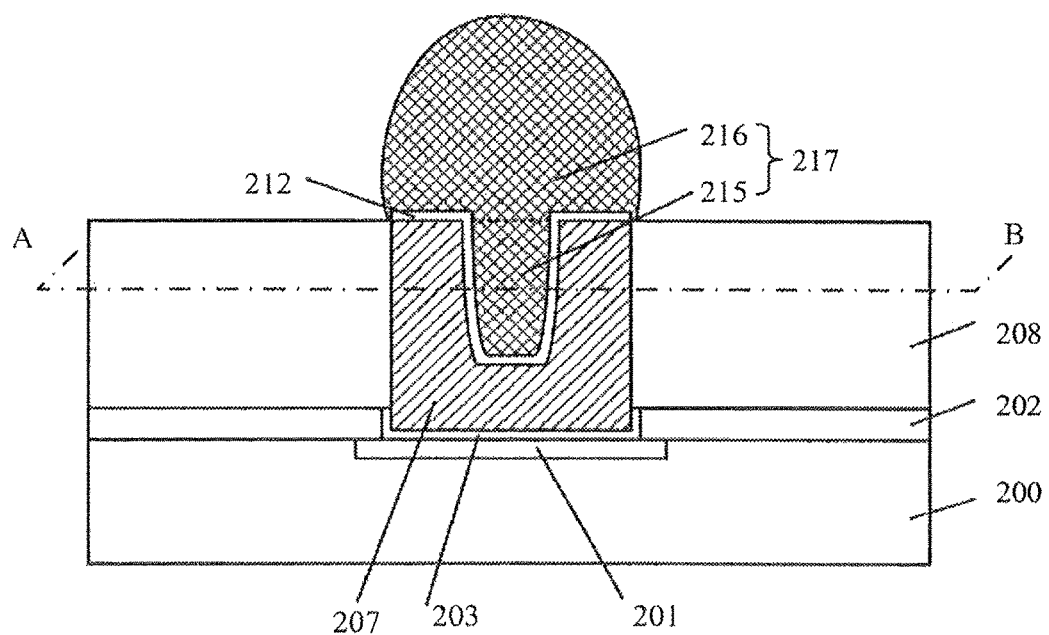
FIGS. 2 to 4 schematically illustrate structural diagrams of a semiconductor device according to an embodiment of the present disclosure.
Figure 3:
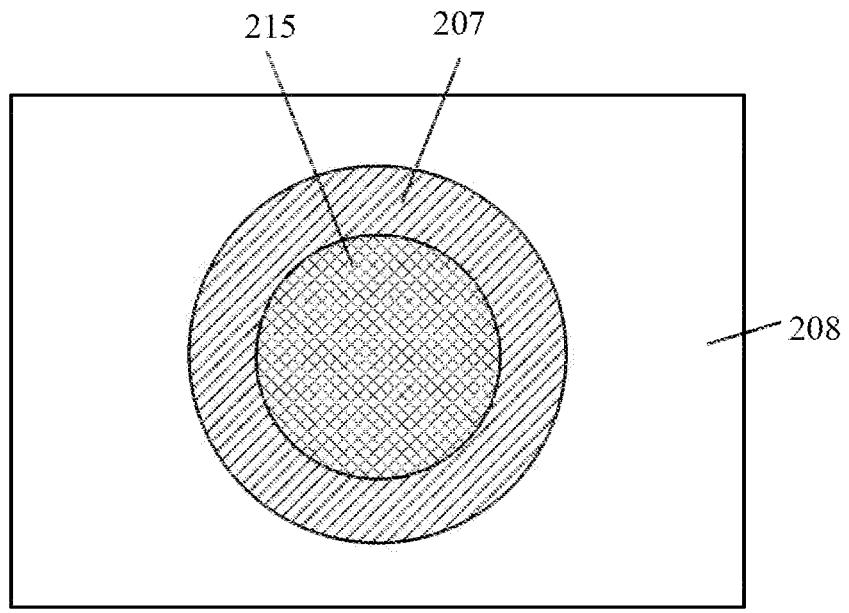
Figure 4:
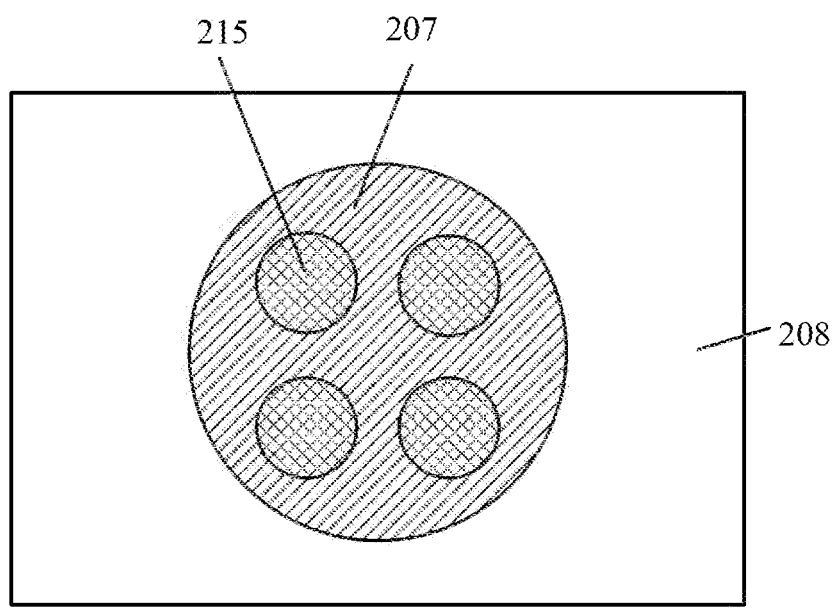

FIGS. 2 to 4 schematically illustrate structural diagrams of a semiconductor device according to an embodiment of the present disclosure. FIGS. 3 and 4 are cross-sectional views of FIG. 2 along a line AB. A metal resist layer is not shown in FIGS. 3 and 4. Referring to FIG. 2, the semiconductor device includes a semiconductor substrate 200 and a pad 201 formed in the semiconductor substrate 200. In embodiments of the present disclosure, for simplicity, one pad is taken for example. In practice, there may be a plurality of pads formed in the semiconductor substrate The semiconductor device further includes: a passivation layer 202 formed on the semiconductor substrate 200, the passivation layer 202 having a first opening which exposes a portion of or the whole top surface of the pad 201; a columnar electrode formed on the pad 201 which is exposed by the first opening, wherein the columnar electrode includes a main body 207 and at least one groove in the main body 207, an opening of the groove is overlapped with a top surface of the main body 207 of the columnar electrode; and a solder ball 217 on the columnar electrode, which includes a metal bump 216 formed on the top surface of the main body 207 and a filling part 215 filled in the at least one groove; a first insulating layer 208 on the passivation layer 202, wherein a top surface of the first insulating layer 208 is flush with or lower than the top surface of the main body 207, and the first insulating layer 208 contacts with a sidewall of the main body 207; a metal resist layer 212 between the solder ball 217 and the main body 207; and a seed layer 203 between the main body 207 and the pad 201.

In some embodiments, a soldering paste may be filled into the groove in the main body 207 to form the filling part 215 of the solder ball 217. A shape and position of the groove correspond to a shape and position of the filling part 215. The depth of the groove may be 0.5% to 99.5% of the height of the main body 207, so that a contact area between the filling part 215 and the main body 207 is increased, which can improve the bonding strength of a bolt like structure constituted by the solder ball 217 and the columnar electrode. Besides, the groove does not penetrate through the main body 207, the connection between the bottom of the main body 207 and the pad 201 (or the seed layer 203) is based on the contact between the material of the main body 207 and the material of the pad 201, which may not affect the bonding between the bottom of the main body 207 and the pad 201 (or the seed layer 203).

From the opening to the bottom of the groove, the groove becomes narrower gradually. In this way, gaps are hardly generated when the soldering paste is filled into the groove, which further strengthens the connection between the solder ball 217 and the columnar electrode. Accordingly, from the opening to the bottom of the groove, the filling part 215 becomes narrower gradually.

In some embodiments, there is one groove in the main body 207, and the diameter of the groove is 1% to 99% of the diameter of the main body 207. Accordingly, there is one filling part 215, and the diameter of the filling part 215 is 1% to 99% of the diameter of the main body 207. A contact area between the filling part 215 and the main body 207 is increased while the mechanical strength of the sidewall of the main body 207 is maintained at a certain level, thus, the bonding strength between the solder ball 217 and the columnar electrode is improved, which prevents the solder ball 217 from falling off the columnar electrode. Referring to FIG. 3, the metal resist layer is not shown. The main body 207 of the columnar electrode includes one filling part 215, and a center of the filling part 215 coincides with the center of the columnar electrode, so that the bonding force between the solder ball and the columnar electrode is distributed evenly in each direction. The cross section of the sidewall of the filling part 215 is a circle, a polygon, a regular polygon, or other regular or irregular shapes. The cross section of the sidewall of the main body 207 is a circle, a polygon, a regular polygon, or other regular or irregular shapes.

In some embodiments, there is more than one groove, which is distributed in the main body 207 independently, for example, in straight line, in matrix, in concentric circle, in concentric ring, in polygon, or irregularly. The number and position of the filling parts 215 correspond to the number and position of the grooves. Accordingly, there is more than one filling part 215, which is distributed in the main body 207 independently, for example, in straight line, in matrix, in concentric circle, in concentric ring, in polygon, or irregularly. Distribution in straight line includes distribution in one straight line through the center of the main body 207, distribution in multiple straight lines through the center of the main body 207, distribution in multiple equiangular straight lines through the center of the main body 207, and distribution in parallel straight lines. Distribution in polygon includes distribution in a regular polygon and distribution in a non-regular polygon. Referring to FIG. 4, the metal resist layer is not shown. In the embodiment, there are four filling parts 215 distributed in rectangle in the main body 207. When there is more than one filling part 215, the number of contact planes between the solder ball 217 and the columnar electrode is increased and thus a contact area is increased. Thus, the bonding between the solder ball 217 and the columnar electrode is further strengthened. Besides, the filling parts 215 are distributed in the main body 207 regularly, which makes the bonding force between the solder ball 217 and the columnar electrode be distributed evenly in each direction. It should be noted that, the above-mentioned distribution ways denote to patterns generated by connecting centers of the grooves (or the filling parts).

Figure 5:
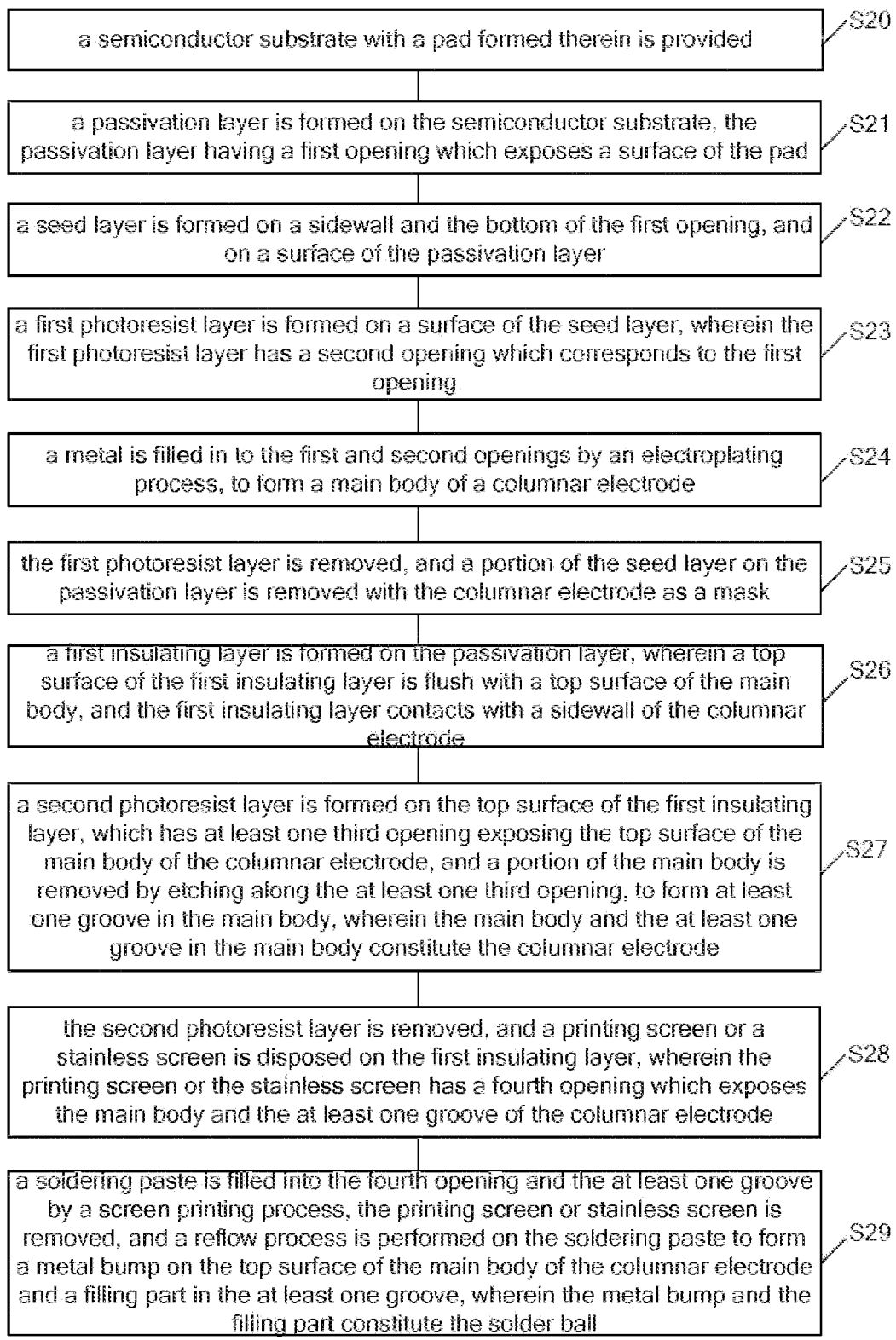
FIG. 5 schematically illustrates a flow chart of a method for forming the semiconductor device in FIG. 2.

FIG. 5 schematically illustrates a flow chart of a method for forming the semiconductor device in FIG. 2. The method includes S20 to S29.

In S20, a semiconductor substrate with a pad formed therein is provided.

In S21, a passivation layer is formed on the semiconductor substrate, the passivation layer having a first opening which exposes a surface of the pad.

In S22, a seed layer is formed on a sidewall and the bottom of the first opening, and on a surface of the passivation layer.

In S23, a first photoresist layer is formed on a surface of the seed layer, wherein the first photoresist layer has a second opening which corresponds to the first opening.

In S24, a metal is filled in to the first and second openings by an electroplating process, to form a main body of a columnar electrode.

In S25, the first photoresist layer is removed, and a portion of the seed layer on the passivation layer is removed with the columnar electrode as a mask.

In S26, a first insulating layer is formed on the passivation layer, wherein a top surface of the first insulating layer is flush with a top surface of the main body, and the first insulating layer contacts with a sidewall of the columnar electrode.

In S27, a second photoresist layer is formed on the top surface of the first insulating layer, which has at least one third opening exposing the top surface of the main body of the columnar electrode, and a portion of the main body is removed by etching along the at least one third opening, to form at least one groove in the main body, wherein the main body and the at least one groove in the main body constitute the columnar electrode.

In S28, the second photoresist layer is removed, and a printing screen or a stainless screen is disposed on the first insulating layer, wherein the printing screen or the stainless screen has a fourth opening which exposes the main body and the at least one groove of the columnar electrode.

In S29, a soldering paste is filled into the fourth opening and the at least one groove by a screen printing process, the printing screen or stainless screen is removed, and a reflow process is performed on the soldering paste to form a metal bump on the top surface of the main body of the columnar electrode and a filling part in the at least one groove, wherein the metal bump and the filling part constitute the solder ball.

FIGS. 6 to 14 schematically illustrate intermediate cross-sectional views of the semiconductor device in FIG. 2. The above steps are described in detail in conjunction with FIGS. 6 to 14 below.

Figure 6:
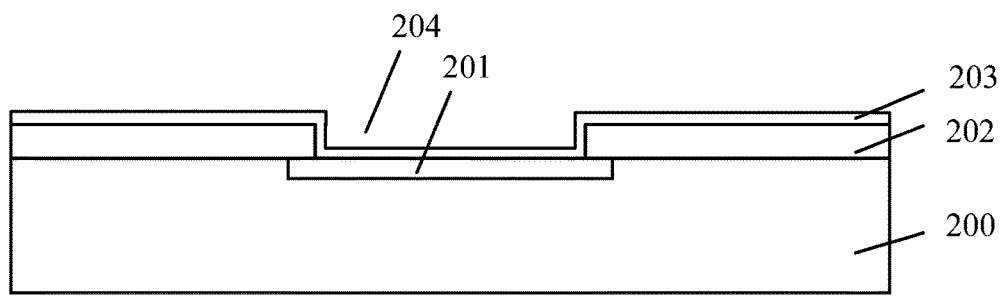
FIGS. 6 to 14 schematically illustrate intermediate cross-sectional views of the semiconductor device in FIG. 2.

Referring to FIG. 6, a semiconductor substrate 200 is provided with a pad 201 formed therein. A passivation layer 202 is formed on the semiconductor substrate 200, the passivation layer 202 having a first opening 204 which exposes a surface of the pad 201. A seed layer 203 is formed on a sidewall and the bottom of the first opening 204, and on a surface of the passivation layer 202.

The semiconductor substrate 200 has a plurality of chips (not shown) thereon, and the pad 201 is connected with corresponding chips.

In some embodiments, the pad 201 may include aluminum, copper, gold or silver, and may be disposed on a surface of the semiconductor substrate 200 or in the semiconductor substrate 200.

The passivation layer 202 is adapted to protecting the chips formed on the semiconductor substrate 200. In some embodiments, the passivation layer 202 may include silicon nitride, borosilicate glass, phosphorosilicate glass, boron phosphorus silicon glass or polyimide. The first opening 204 in the passivation layer 202 exposes a portion of or the whole top surface of the pad 201. In some embodiments, the passivation layer 202 may be a single layer or a stacked structure of multiple layers.

The seed layer 203 serves as a power supply layer when an electroplating process is used to form a main body of a columnar electrode. In some embodiments, the seed layer 203 may be a single metal layer of chromium, titanium, tantalum, or a stacked structure consisting of a first metal layer, such as chromium, titanium or tantalum, and a second metal layer, such as copper, gold or silver. The seed layer 203 may be formed by a sputtering process. In some embodiments, the seed layer 203 may further serve as a diffusion resist layer to prevent the metal in the columnar electrode to be formed from diffusing into the passivation layer 202 and to strengthen the bonding between the columnar electrode and the passivation layer 202.

It should be noted that, hereinafter, the first opening denotes to the remained first opening after the seed layer 203 is formed.

Figure 7:
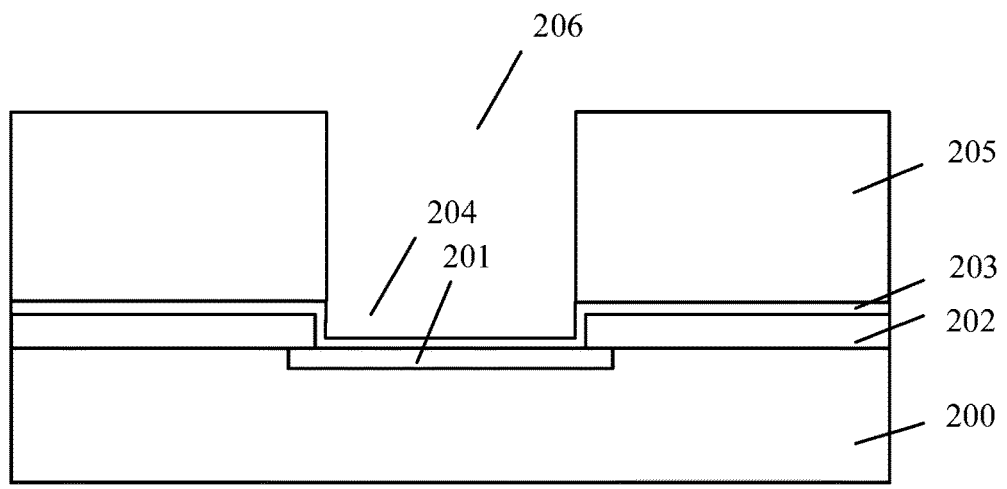
Figure 8:
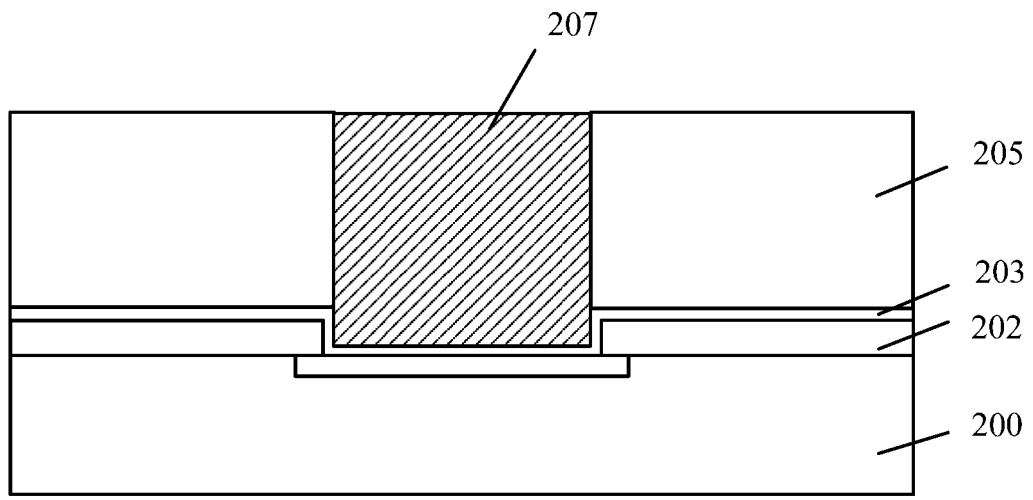

Afterwards, referring to FIGS. 7 and 8, a first photoresist layer 205 is formed on a surface of the seed layer 203, wherein the first photoresist layer 205 has a second opening 206 which corresponds to the first opening 204. A metal is filled into the first and second openings to form a main body 207 of the columnar electrode.

In some embodiments, the second opening 206 may be formed by an exposure and developing process. The width of the second opening 206 may be greater than or equal to the width of the first opening 204. In the subsequent process, the main body 207 is formed on a surface of a portion of the seed layer 203 on the passivation layer 202 by using an electroplating process.

In some embodiments, the metal filled into the first and second openings is copper, and a process for filling the metal is an electroplating process.

Figure 9:
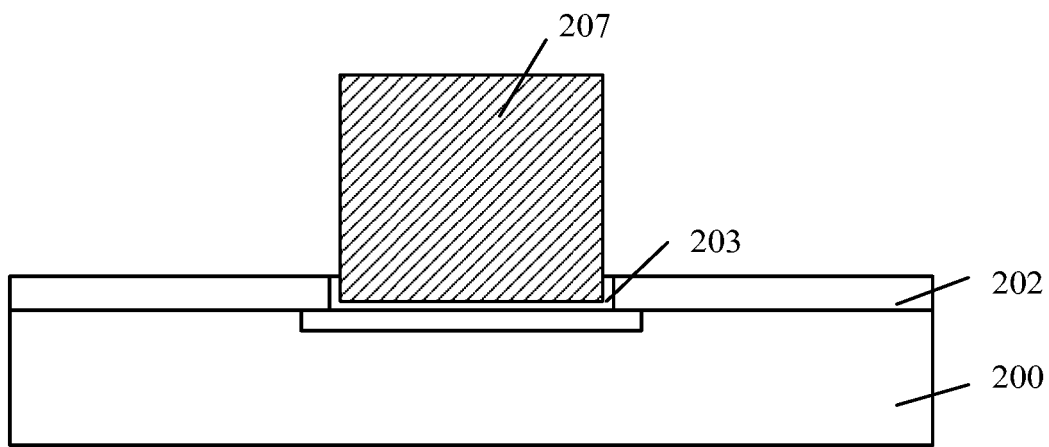

Afterward, referring to FIG. 9, the first photoresist layer 205 is removed (referring to FIG. 8), and the portion of the seed layer 203 on the passivation layer 202 is removed with the columnar electrode as a mask.

In some embodiments, the first photoresist layer 205 may be removed by a wet etching process or an ashing process. The portion of the seed layer 203 on the passivation layer 202 may be removed by a dry etching process or a wet etching process. When the portion of the seed layer 203 is removed, a mask layer may be formed on a top surface of the main body 207 of the columnar electrode.

In some embodiments, a portion of the seed layer 203 may be exposed on the passivation layer 202. When the seed layer 203 is etched, a mask layer may be formed on the top surface of the main body 207 and on a surface of the portion of the seed layer 203.

Figure 10:
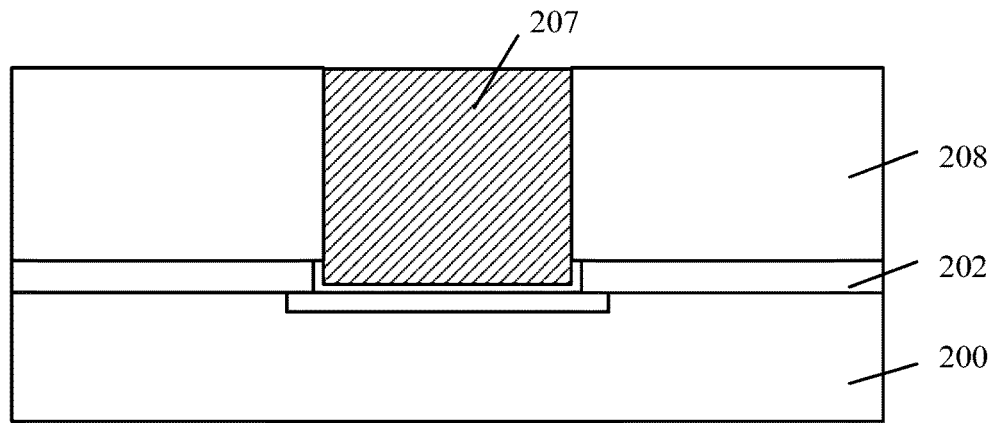

Afterward, referring to FIG. 10, a first insulating layer 208 is formed on the passivation layer 202, wherein a top surface of the first insulating layer 208 is flush with the top surface of the main body 207, and the first insulating layer 208 contacts with a sidewall of the main body 207 of the columnar electrode.

The first insulating layer 208 serves as an electric insulating layer and a sealing material layer. In some embodiments, the first insulating layer 208 may include an organic resin, such as polybenzoxazole or polyimide.

Forming the first insulating layer 208 may further include: performing a planarization process to the first insulating layer 208 formed on the surface of the passivation layer 202, to make the top surface of the first insulating layer 208 be flush with the top surface of the main body 207 of the columnar electrode.

In some embodiments, the first insulating layer 208 is formed before a groove is formed in the main body 207. If the first insulating layer 208 is formed after formation of the groove, the first insulating layer 208 may be filled in the groove, and thus an extra etching process needs to be performed to remove the first insulating layer 208 in the groove.

Figure 11:
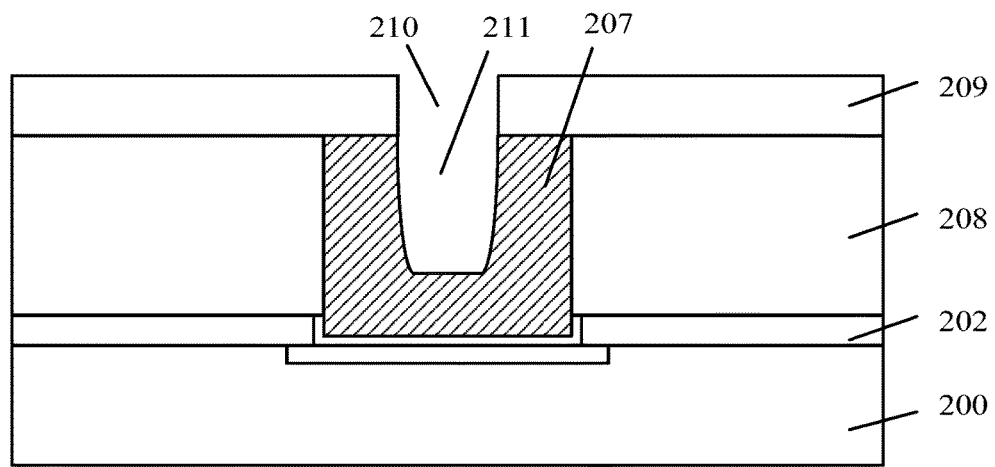

Afterward, referring to FIG. 11, a second photoresist layer 209 is formed on a surface of the first insulating layer 208, which has at least one third opening 210 exposing the top surface of the main body 207 of the columnar electrode, and a portion of the main body 207 is removed by etching along the at least one third opening 210, to form at least one groove 211 in the main body 207, wherein the remained main body 207 and the at least one groove 211 in the main body 207 constitute the columnar electrode.

In some embodiments, the third opening 210 may be formed by an exposure and developing process. The number, position and shape of the at least one third opening 210 correspond to the number, position and shape of the at least one groove 211. The detailed distribution of the at least one third opening 210 may be similar with the distribution of the grooves in the semiconductor device above.

In some embodiments, the main body 207 may be etched by a reactive ion etching process or a wet etching process. In the reactive ion etching process, chlorine may be used. In the wet etching process, an attenuate sulphoacid solution, a solution mixed by hydrogen peroxide and sulphoacid, or other suitable etching solution may be used. In some embodiments, the depth of the groove 211 is 0.5% to 99.5% to the height of the main body 207, so that a contact area between a filling part in the groove and the main body 207 is increased, which can strengthen the bonding of a bolt like structure constituted by a solder ball 217 and the columnar electrode.

From the opening to the bottom of the groove 211, the groove 211 becomes narrower gradually. In this way, gaps are hardly generated when a soldering paste is filled into the groove subsequently, which may further strengthen the connection between the solder ball 217 and the columnar electrode. A sidewall of the groove 211 may be step-shaped, a skew straight line or a skew arc. During an etching process, a bias power or a concentration of an etching solution may be controlled to form the groove 211 which has an upper portion wider than a lower portion.

In some embodiments, the bottom of the groove 211 may be flat, curve or irregular.

In some embodiments, the cross section of the groove 211 may be a circle, a polygon, a regular polygon, or other regular or irregular shapes. In the embodiment, the groove has a circular cross section.

In some embodiments, there is one groove 211 in the main body 207, and the diameter of the groove 211 is 1% to 99% of the diameter of the main body 207. Accordingly, there is one filling part to be formed subsequently. A contact area between the filling part and the main body 207 is increased while the mechanical strength of the sidewall of the main body 207 is maintained at a certain level, thus, the bonding between the solder ball and the columnar electrode is strengthened, which prevents the solder ball from falling off the columnar electrode.

In some embodiments, there is more than one groove 211, which is distributed in the main body 207 independently, for example, in straight line, in matrix, in concentric circle, in concentric ring, in polygon, or irregularly. The number and position of the filling parts correspond to the number and position of the grooves 211. Accordingly, there is more than one filling part to be formed. When there is more than one filling part, the number of contact planes between the solder ball and the columnar electrode is increased and further a contact area therebetween is increased. Thus, the bonding between the solder ball and the columnar electrode is further strengthened. Besides, the filling parts are distributed in the main body 207 regularly, which enables the bonding force between the solder ball and the columnar electrode to be distributed evenly in each direction. It should be noted that, the above-mentioned distribution ways denote to patterns generated by connecting centers of the grooves 211 (or the filling parts).

Figure 12:
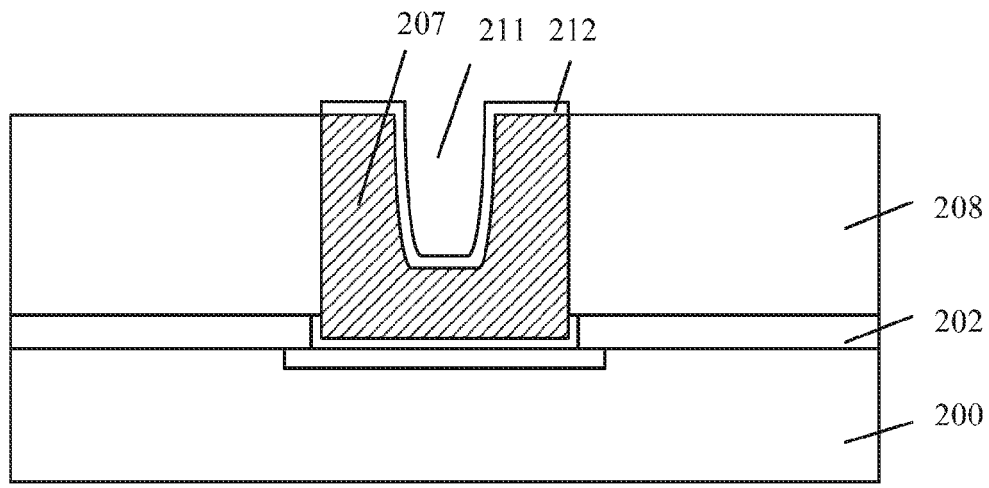

Referring to FIG. 12, the second photoresist layer 209 is removed, and a metal resist layer 212 is formed on a sidewall and the bottom of the groove 211, and on the top surface of the main body 207.

The metal resist layer 212 is adapted to prevent the solder ball to be formed from directly contacting with the main body 207, which avoids generation of fragile copper-tin intermetallic compound on the contact plane and further ensures the reliability of welded spot. In the existing techniques, a solder ball contacts with a columnar electrode directly, thus, when the temperature is relatively high, copper in the columnar electrode may diffuse to tin in the solder ball rapidly, and copper-tin intermetallic compound may be formed on a contact plane between the columnar electrode and the solder ball. As the copper-tin intermetallic compound generally has great fragility, the mechanical strength of the contact plane may be reduced, and welded spots may break at the boundary between the copper-tin intermetallic compound and a soldering paste, which directly affects the reliability of welding.

In some embodiments, the metal resist layer 212 may be a double-layer structure of nickel and tin, nickel and silver, nickel and gold, or nickel and tin alloy. The layer of tin, silver, gold or tin alloy is formed on a surface of the layer of nickel, to avoid the oxidation of nickel. In the embodiment, the metal resist layer 212 is a double-layer structure of nickel and tin. The layer of nickel can avoid the diffusion of copper. Even if some copper and nickel diffuse to the metal resist layer 212, compounds of nickel and copper generated on the contact plane between the metal resist layer 212 and the columnar electrode have relatively high intensity and pyroelectricity, and compounds of nickel and tin generated on the contact plane between the metal resist layer 212 and the solder ball have relatively high intensity, high hardness, and even surfaces, thus, the mechanical strength of the contact planes may not be decreased, and welding damage may not occur.

In some embodiments, the thickness of the metal resist layer 212 may be less than the diameter of the groove 211, which may prevent the metal resist layer 212 from blocking the groove 211.

In some embodiments, the metal resist layer 212 may be formed by a selective chemical plating process, that is, the metal resist layer 212 may be formed on metal surfaces selectively.

During the selective chemical plating process, ultrasonic vibration may be employed, so as to avoid bubbles, which may affect the formation of the metal resist layer 212, being generated in the groove 211 when a chemical plating solution enters the groove 211. In some embodiments, the ultrasonic may have a frequency greater than 20 KHz.

During the selective chemical plating process, a pressure greater than the standard atmosphere may be applied in a chemical plating chamber, to enable the chemical plating solution to have a pressure. As a result, the chemical plating solution is prone to enter the groove 211, and no bubbles will be generated in the groove 211.

In some embodiments, if a chemical plating process is not selective, a mask layer may be formed on columnar electrode after the chemical plating process. Then, a portion of the metal resist layer on the first insulating layer is removed by taking the mask layer as a mask.

In some embodiments, the metal resist layer may be formed by a sputtering process.

Figure 13:
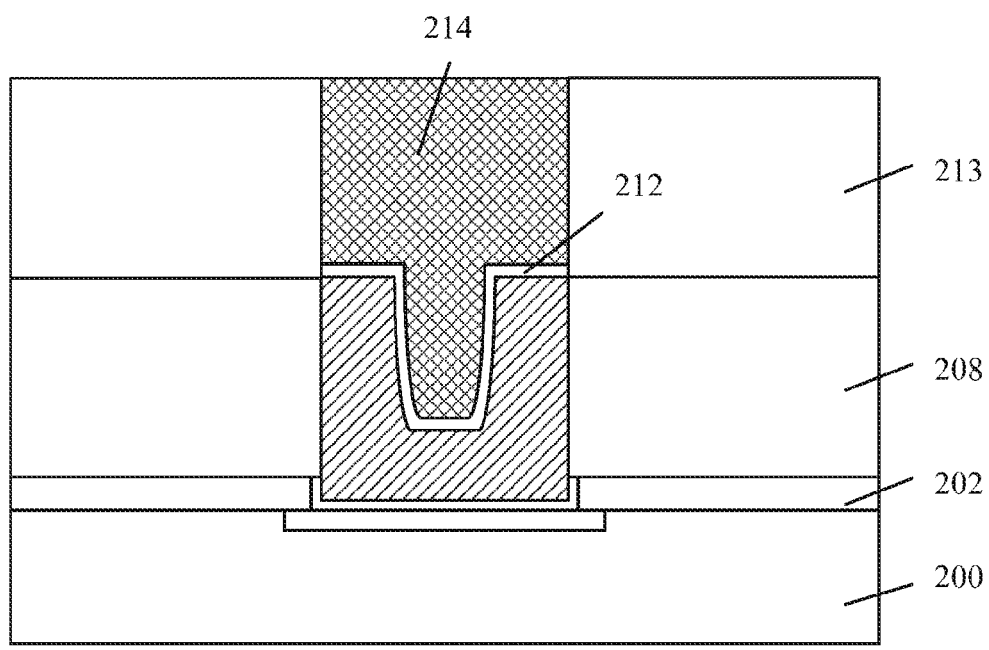

Afterward, referring to FIG. 13, a printing screen 213 or a stainless screen 213 is disposed on the first insulating layer 208, wherein the printing screen 213 or the stainless screen 213 has a fourth opening which exposes the top surface of the main body 207 and the groove 211 in the main body 207. And a soldering paste 214 is filled into the fourth opening and the groove 211 by a screen printing process.

In some embodiments, the soldering paste 214 may include tin or tin alloy.

Figure 14:
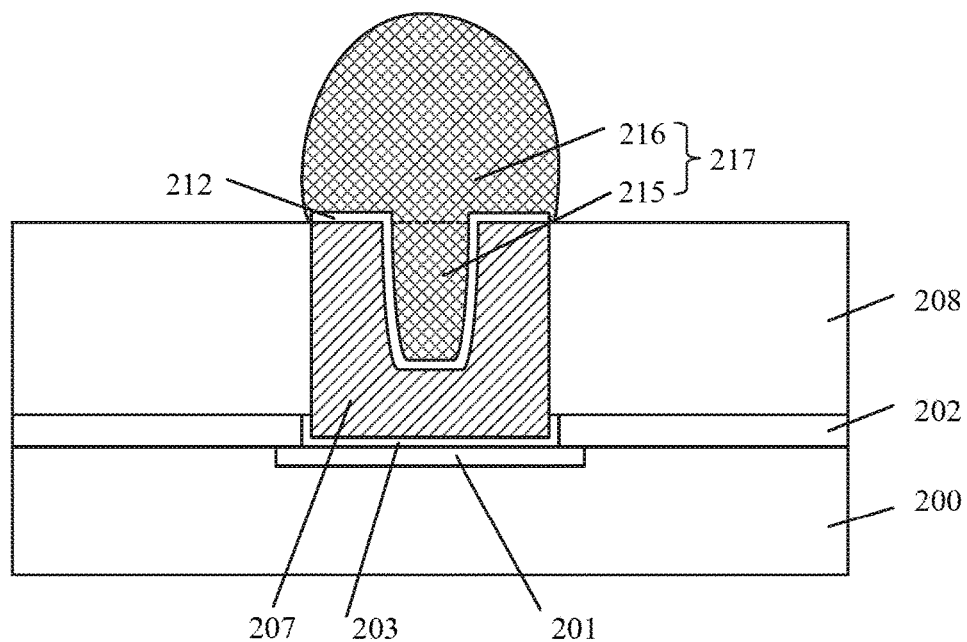

Afterward, referring to FIG. 14, the printing screen 213 or the stainless screen 213 is removed, and a reflow process is performed on the soldering paste 214 (referring to FIG. 13) to form a metal bump 216 on the top surface of the main body 207 of the columnar electrode and the filling part 215 in the groove 211 (referring to FIG. 12), wherein the metal bump 216 and the filling part 215 constitute the solder ball 217.

In some embodiments, the reflow process may include a thermal processing process.

Figure 15:
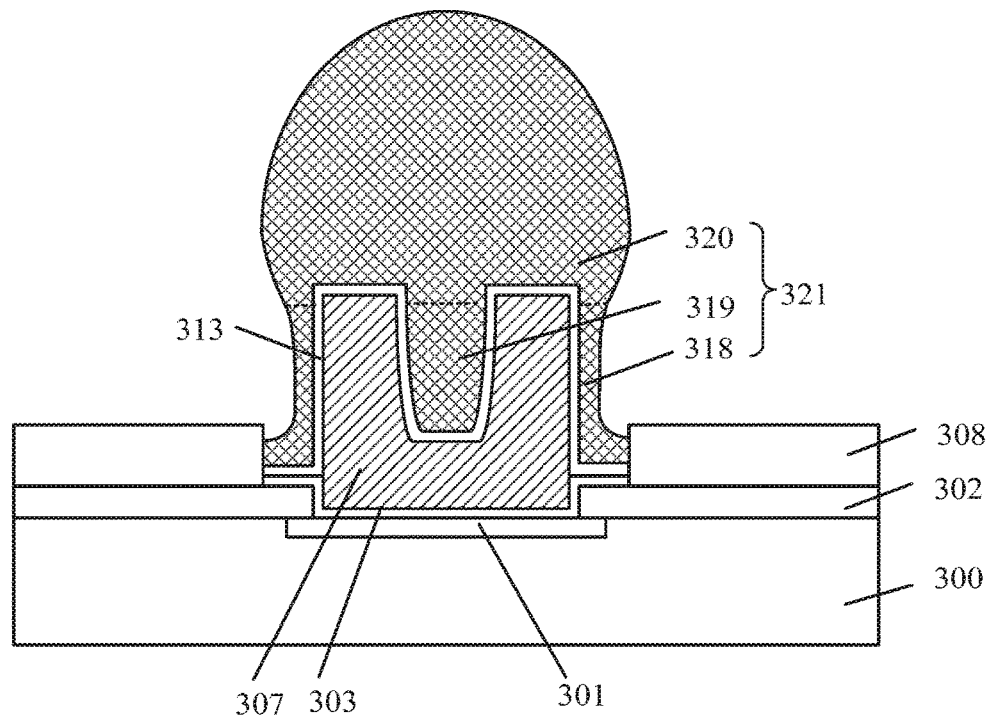
FIG. 15 schematically illustrates a structural diagram of a semiconductor device according to an embodiment of the present disclosure.

Referring to FIG. 15, FIG. 15 schematically illustrates a structural diagram of a semiconductor device according to an embodiment of the present disclosure. The semiconductor device includes: a semiconductor substrate 300 having a pad 301 formed therein; a passivation layer 302 formed on the semiconductor substrate 300, the passivation layer 302 having a first opening which exposes at least a portion of a surface of the pad 301; a columnar electrode formed on the pad 301, wherein the columnar electrode includes a main body 307 and at least one groove in the main body 307, an opening of the groove is flush with a top surface of the main body 307; a first insulating layer 308 on the passivation layer 302, wherein a top surface of the first insulating layer 308 is lower than the top surface of the main body 307, a first annular groove is formed between the first insulating layer 308 and the main body 307 of the columnar electrode; a metal bump 320 formed on the top surface of the main body 307 and a filling part 319 filled in the at least one groove; a margin part 318 surrounding the sidewall of the main body 307, wherein an upper portion of the margin part 318 is connected with the metal bump 320, a lower portion of the margin part 318 is disposed in the first annular groove and connected with a portion of the passivation layer 302 beside of the columnar electrode, the lower portion has a width greater than that of the upper portion, a surface of the lower portion is lower than, flush with or higher than the top surface of the first insulating layer 308, and the metal bump 320, the filling part 319 and the margin part 318 constitute a solder ball 321; a seed layer 303 between the main body 307 and the pad 301, wherein a portion of the seed layer 303 is formed on a surface of a portion of the passivation layer 302 in the first annular groove; and a metal resist layer 313 between the solder ball 321 and the main body 307, wherein a portion of the metal resist layer 313 is formed on a surface of a portion of the seed layer 303 in the first annular groove.

The number, size and distribution of the at least one groove in the main body 307 may be similar with the embodiment shown in FIGS. 2 to 14, and are not described in detail here.

The difference between the embodiment shown in FIGS. 2 to 14 and the embodiment shown in FIGS. 15 to 24 is described as follows. In the latter embodiment, the solder ball 321 further includes the L-shaped margin part 318 surrounding the sidewall of the main body 307. Compared with the embodiment shown in FIGS. 2 to 14, the solder ball 321 not only contacts with the top surface of the main body 307 and the inner of the groove in the main body 307, but also contacts with the sidewall of the main body 307. As a result, the number of contact planes and a contact area between the solder ball 321 and the columnar electrode to be further increased. When an external force is applied to the solder ball 321, the external force may be diffused, which can strengthen the bonding between the solder ball 321 and the columnar electrode.

The L-shaped margin part 318 contacts with the sidewall of the first annular groove, the sidewall of the main body 307 (or a portion of the metal resist layer 313 surrounding the sidewall of the main body 307) and the portion of the passivation layer 302 in the first annular groove (or a portion of the metal resist layer 313 on the portion of the passivation layer 302 in the first annular groove), and the width of the lower portion of the L-shaped margin part 318 is greater than that of the upper portion. Thus, the L-shaped margin part 318 serves as a brace, which enables the solder ball can be applied with a greater lateral external force (a force which can make the solder ball fall off the columnar electrode), and prevents the solder ball from falling off the columnar electrode.

Figure 16:
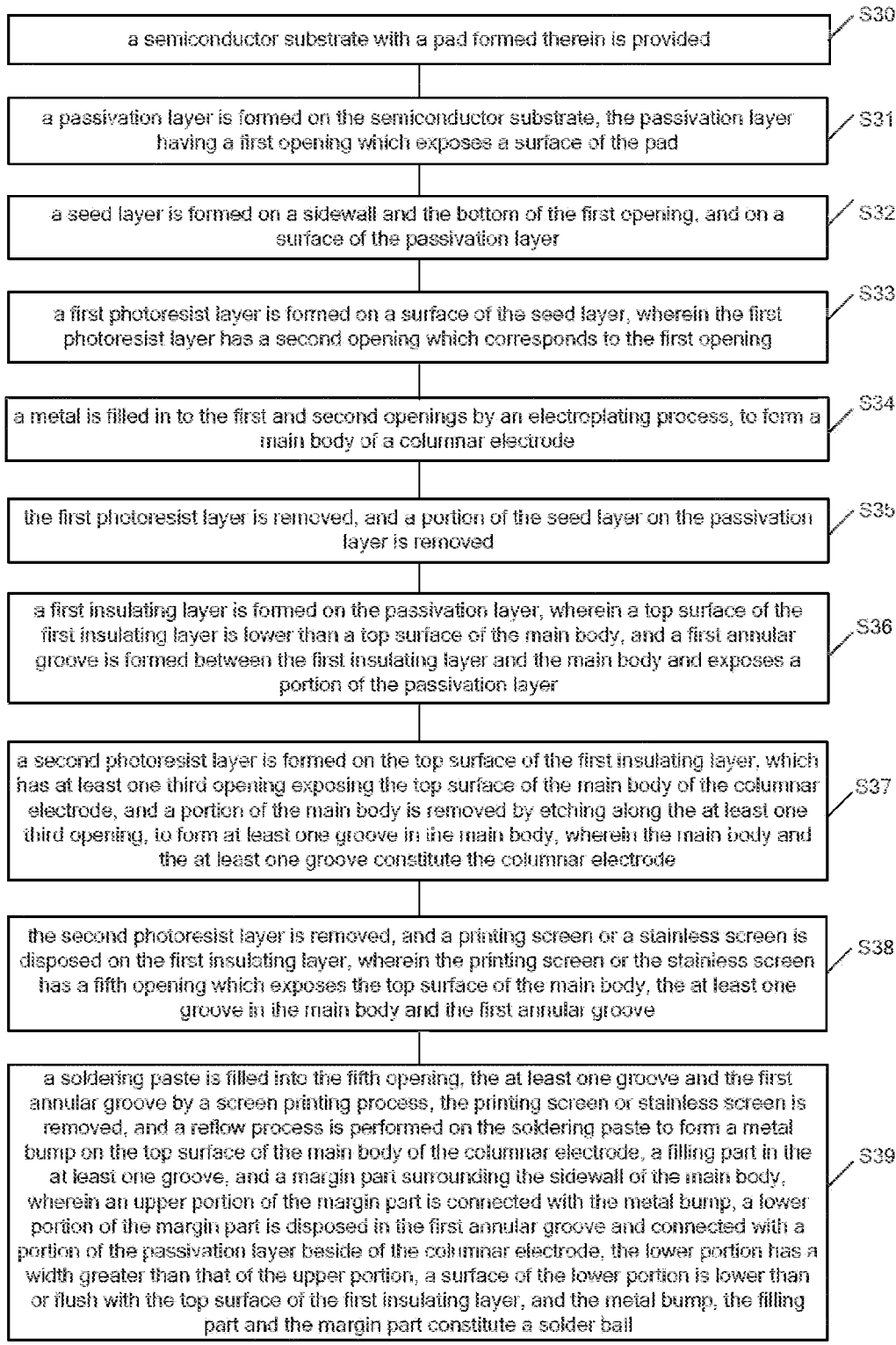
FIG. 16 schematically illustrates a flow chart of a method for forming the semiconductor device in FIG. 15.

Referring to FIG. 16, FIG. 16 schematically illustrates a flow chart of a method for forming the semiconductor device in the embodiment shown in FIG. 15. The method includes S30 to S39.

In S30, a semiconductor substrate with a pad formed therein is provided.

In S31, a passivation layer is formed on the semiconductor substrate, the passivation layer having a first opening which exposes a surface of the pad.

In S32, a seed layer is formed on a sidewall and the bottom of the first opening, and on a surface of the passivation layer.

In S33, a first photoresist layer is formed on a surface of the seed layer, wherein the first photoresist layer has a second opening which corresponds to the first opening.

In S34, a metal is filled in to the first and second openings by an electroplating process, to form a main body of a columnar electrode.

In S35, the first photoresist layer is removed, and a portion of the seed layer on the passivation layer is removed.

In S36, a first insulating layer is formed on the passivation layer, wherein a top surface of the first insulating layer is lower than a top surface of the main body, and a first annular groove is formed between the first insulating layer and the main body and exposes a portion of the passivation layer.

In S37, a second photoresist layer is formed on the top surface of the first insulating layer, which has at least one third opening exposing the top surface of the main body of the columnar electrode, and a portion of the main body is removed by etching along the at least one third opening, to form at least one groove in the main body, wherein the main body and the at least one groove constitute the columnar electrode.

In S38, the second photoresist layer is removed, and a printing screen or a stainless screen is disposed on the first insulating layer, wherein the printing screen or the stainless screen has a fifth opening which exposes the top surface of the main body, the at least one groove in the main body and the first annular groove.

In S39, a soldering paste is filled into the fifth opening, the at least one groove and the first annular groove by a screen printing process, the printing screen or stainless screen is removed, and a reflow process is performed on the soldering paste to form a metal bump on the top surface of the main body of the columnar electrode, a filling part in the at least one groove, and a margin part surrounding the sidewall of the main body, wherein an upper portion of the margin part is connected with the metal bump, a lower portion of the margin part is disposed in the first annular groove and connected with a portion of a metal barrier layer beside of the columnar electrode, the lower portion has a width greater than that of the upper portion, a surface of the lower portion is lower than or flush with the top surface of the first insulating layer, and the metal bump, the filling part and the margin part constitute a solder ball.

FIGS. 17 to 24 schematically illustrate intermediate cross-sectional views of the semiconductor device in the embodiment shown in FIG. 15. The above steps are described in detail in conjunction with FIGS. 17 to 24 below.

Figure 17:
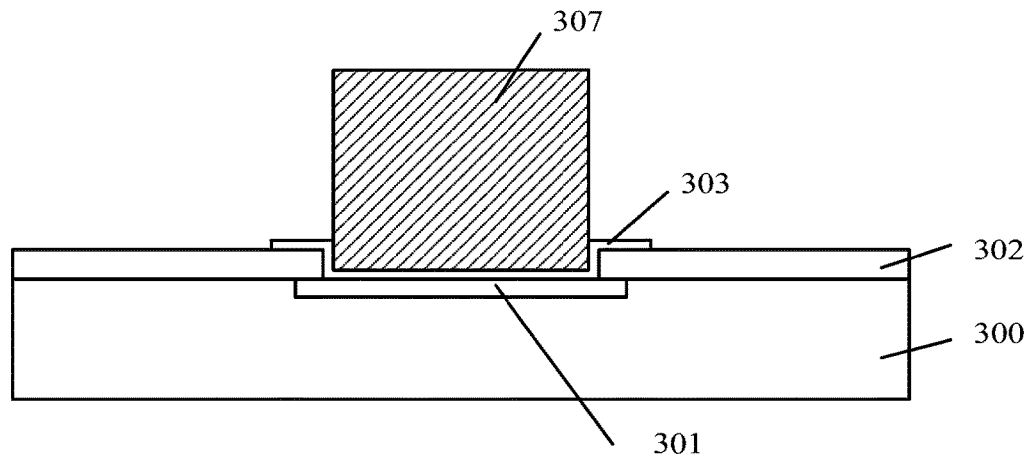
FIGS. 17 to 24 schematically illustrate intermediate cross-sectional views of the semiconductor device in FIG. 15.

Referring to FIG. 17, a semiconductor substrate 300 is provided with a pad 301 formed therein. A passivation layer 302 is formed on the semiconductor substrate 300, the passivation layer 302 having a first opening which exposes at least a portion of a surface of the pad 301. A main body 307 of a columnar electrode is formed on the portion of the surface of the pad 301.

A seed layer 303 is further formed between the main body 307 and the pad 301. A portion of the seed layer 303 is formed on a surface of a portion of the passivation layer 302 which is close to the main body 307. After the main body 307 is formed using an electroplating process by taking the seed layer 303 as a conductive layer, a patterned photoresist layer covering the main body 307 and a portion of the seed layer 303 (a portion of the seed layer 303 on the surface of the portion of the passivation layer 302 which is close to the main body 307) needs to be formed. Afterward, with the patterned photoresist layer as a mask, a portion of the seed layer 303 on the passivation layer 302 which is far away from the main body 307 may be removed. The patterned photoresist layer is removed. In this way, the remained seed layer 303 has one portion disposed between the main body 307 and the pad 301, and the other portion disposed on the surface of the portion of the passivation layer 302 which is close to the main body 303.

The detailed forming processes may be similar with the embodiment shown in FIGS. 2 to 14, and are not described in detail here. It should be noted that, hereinafter, forming processes and materials of structures in below embodiments which are similar with the semiconductor device shown in FIGS. 2 to 14 are not described in detail, and can be found in the description for the embodiment shown in FIGS. 2 to 14.

Figure 18:
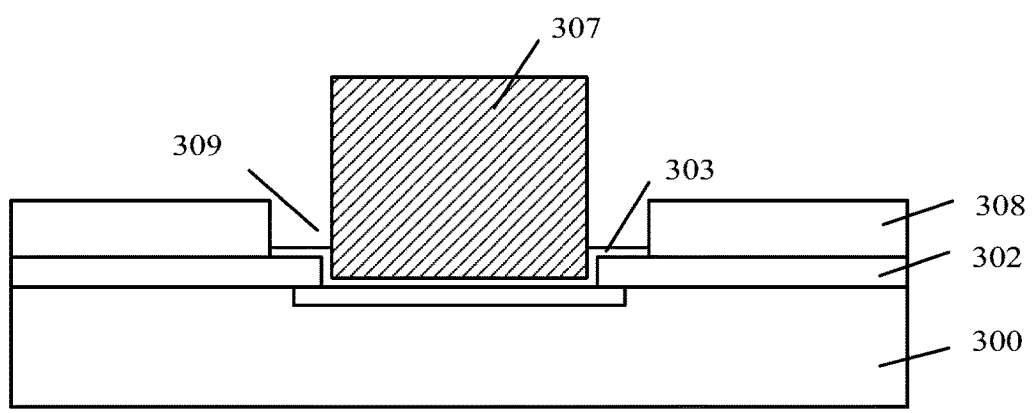

Afterward, referring to FIG. 18, a first insulating layer 208 is formed on a surface of the passivation layer 302, a top surface of the first insulating layer 208 being lower than a top surface of the main body 307, and a first annular groove 309 is formed between the first insulating layer 308 and the main body 307. The first annular groove 309 may be formed by a photolithography process and an etching process, or other suitable processes.

Figure 19:
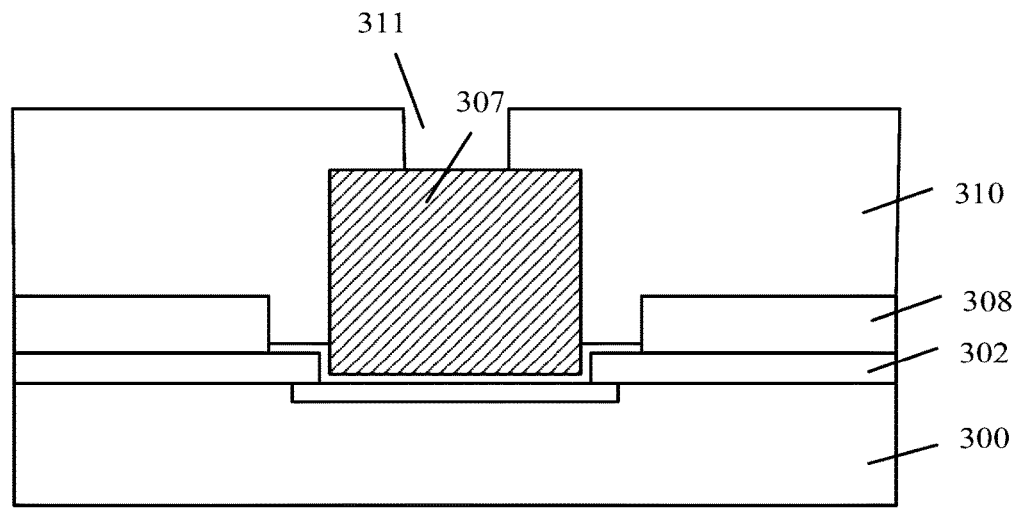
Figure 20:
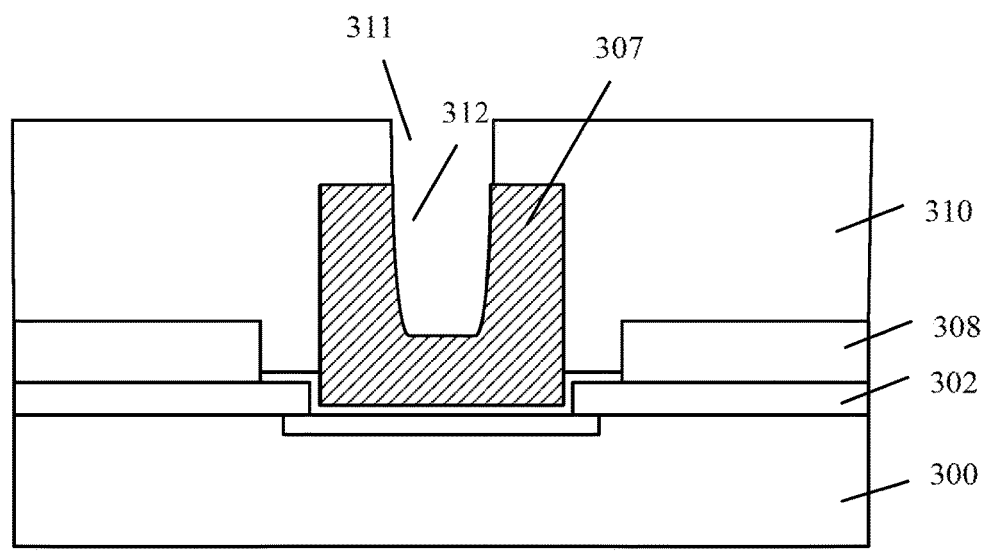

Afterward, referring to FIGS. 19 and 20, a second photoresist layer 310 is formed on the top surface of the first insulating layer 308, which has at least one third opening 311 exposing the top surface of the main body 307 of the columnar electrode, and a portion of the main body 307 is removed by etching along the at least one third opening 311, to form at least one groove 312 in the main body 307, wherein the main body 307 and the at least one groove 312 constitute the columnar electrode.

Figure 21:
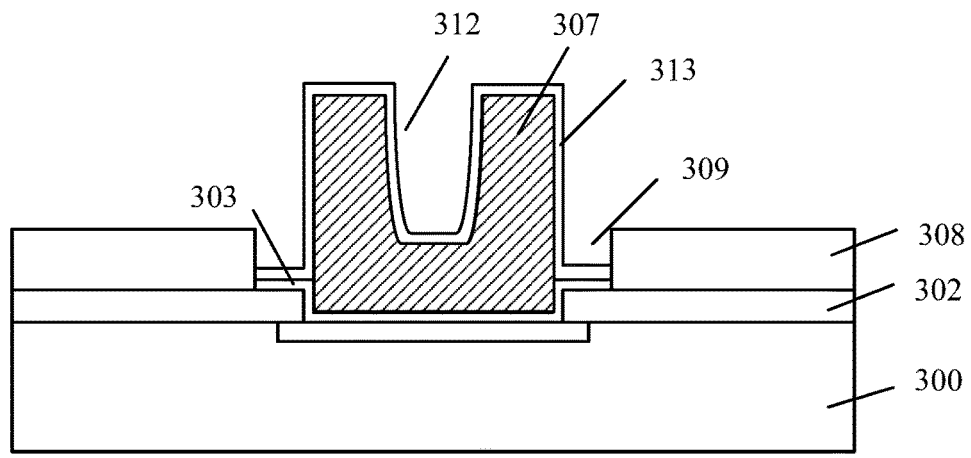

Afterward, referring to FIG. 21, the second photoresist layer 310 (referring to FIG. 20) is removed, and a metal resist layer 313 is formed on a sidewall and the bottom of the groove 312 in the main body 307, and on the top surface and an inner sidewall of the main body 207. A portion of the metal resist layer 313 is disposed on a surface of a portion of the seed layer 303 in the first annular groove 309.

Figure 22:
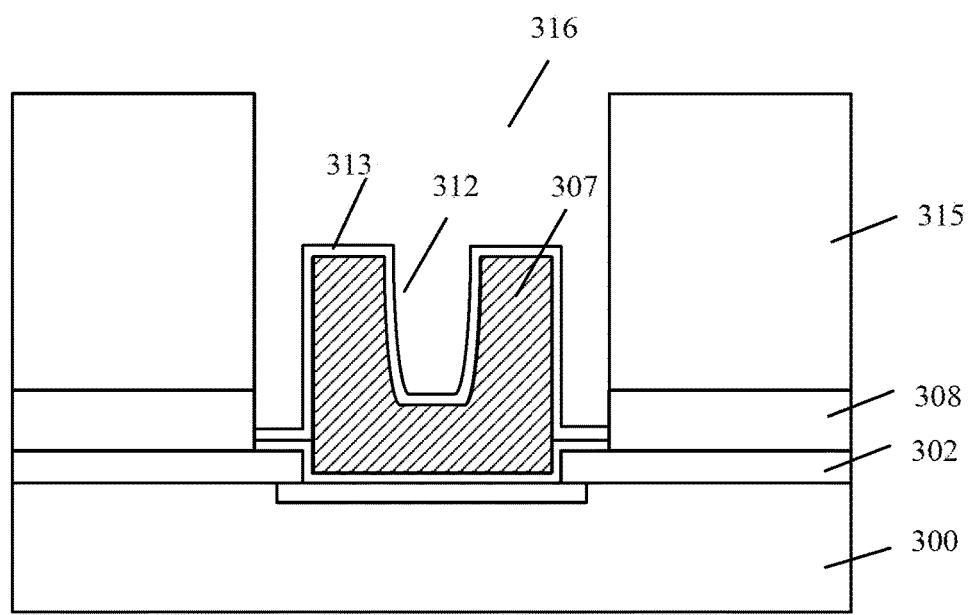

Afterward, referring to FIG. 22, a printing screen 315 or a stainless screen 315 is disposed on the first insulating layer 308, wherein the printing screen 315 or the stainless screen 315 has a fifth opening 316 which exposes the top surface of the main body 307, the at least one groove 312 in the main body 307 and the first annular groove 309.

Figure 23:
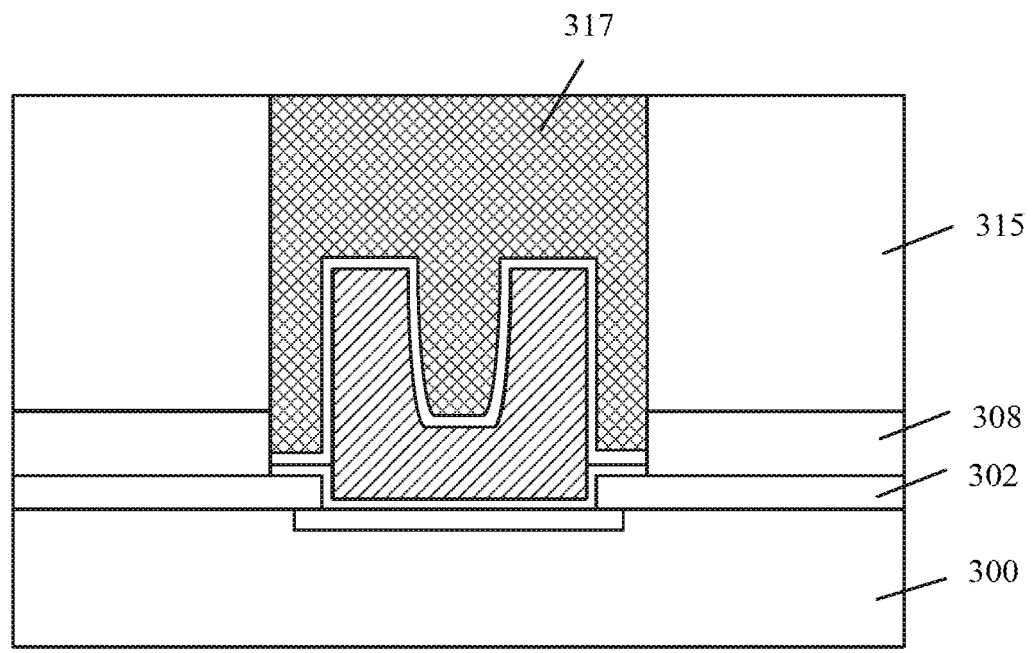
Figure 24:
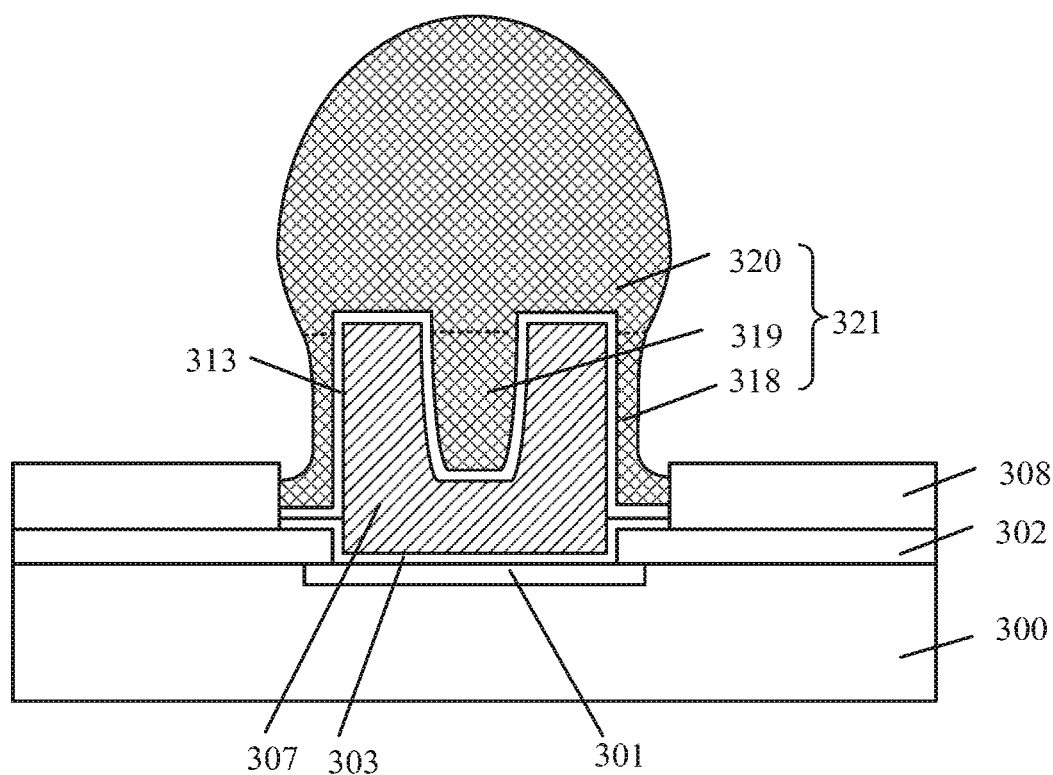

Afterward, referring to FIGS. 23 and 24, a soldering paste 317 is filled into the fifth opening 316, the at least one groove 312 and the first annular groove 309 by a screen printing process, the printing screen 315 or stainless screen 315 is removed, and a reflow process is performed on the soldering paste 317 to form a metal bump 320 on the top surface of the main body 307 of the columnar electrode, a filling part 319 in the at least one groove 312, and a margin part 318 surrounding the sidewall of the main body 307, wherein an upper portion of the margin part 318 is connected with the metal bump 320, a lower portion of the margin part 318 is disposed in the first annular groove 309 and connected with a portion of the metal resist layer 313 beside of the columnar electrode, the lower portion has a width greater than that of the upper portion, a surface of the lower portion is lower than, flush with or higher than the top surface of the first insulating layer 308, and the metal bump 320, the filling part 319 and the margin part 318 constitute a solder ball 321.

During the reflow process, the soldering paste 317 on the top surface of the columnar electrode forms the metal bump 320 under the surface tension. The top surface of the columnar electrode is higher than the top surface of the first insulating layer 308, and a portion of the soldering paste 317 on a middle portion of the sidewall of the main body 307 only contacts with the surface where the sidewall of the main body 307 is located, thus, the portion of the soldering paste 317 may move to the metal bump 320 under the surface tension. A portion of the soldering paste 317 on a lower portion of the sidewall of the main body 307 and in the first annular groove 309 contacts with three surfaces, including the sidewall of the first annular groove 309, a portion of the metal resist layer 313 surrounding the sidewall of the main body 307 and a portion of the metal resist layer 313 on the seed layer 303. During the reflow process, an adsorption force at a contact plane between a portion of the metal resist layer 313 above the pad 301 and the soldering paste 317 in the first annular groove may eliminate some surface tension the soldering paste 317 in the first annular groove applies to a direction of the metal bump 320 and to a direction of the main body 307 of the columnar electrode. In this way, the L-shaped margin part 318 is formed surrounding the sidewall of the main body 307.

Figure 25:
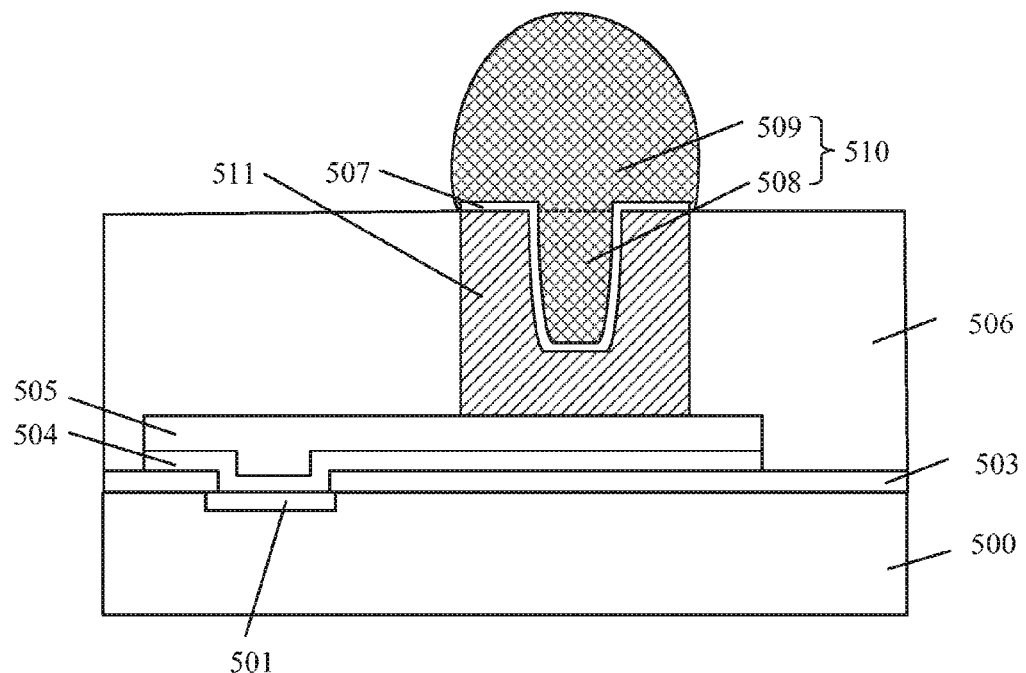
FIG. 25 schematically illustrates a structural diagram of a semiconductor device according to an embodiment of the present disclosure.

Referring to FIG. 25, FIG. 25 schematically illustrates a structural diagram of a semiconductor device according to an embodiment of the present disclosure. The semiconductor device includes: a semiconductor substrate 500 with a pad 501 formed therein; a passivation layer 503 formed on the semiconductor substrate 500, the passivation layer 503 having a first opening which exposes at least a portion of a surface of the pad 501; a seed layer 504 formed on a sidewall and the bottom of the first opening, and on a surface of a portion of the passivation layer 503; a redistribution layer 505 formed on a surface of the seed layer 504, the redistribution layer 505 being filled in the first opening and serving as an extended part of the pad 501; a columnar electrode formed on a surface of a portion of the redistribution layer 505 outside the first opening, wherein the columnar electrode includes a main body 511 and at least one groove in the main body 511, an opening of the groove is overlapped with a top surface of the main body 511 of the columnar electrode; a solder ball 510 on the columnar electrode, which includes a metal bump 509 formed on the top surface of the main body 511 and a filling part 508 filled in the at least one groove; a second insulating layer 506 formed covering the passivation layer 503 and the redistribution layer 505, wherein a top surface of the second insulating layer 506 is flush with the top surface of the main body 511, and the second insulating layer 506 contacts with a sidewall of the main body 511; and a metal resist layer 507 between the solder ball 510 and the main body 511 of the columnar electrode.

Compared with the embodiment shown in FIGS. 15 to 24, the semiconductor device in this embodiment further has the redistribution layer 505 which serves as an extended part of the pad 501. The columnar electrode is formed on the redistribution layer 505 other than directly on the pad. The redistribution layer 505 can realize the redistribution of contact points, which may improve an integration level of packaged devices.

In some embodiments, the redistribution layer 505 may be formed by an electroplating process and include copper. The redistribution layer 505 may be formed by: forming the seed layer 504 on a sidewall and the bottom of the first opening, and on the surface of the passivation layer 503; forming a photoresist layer on the seed layer 504, which has a second opening exposing a surface of the seed layer 504, the second opening having a width and position which correspond to a width and position of the redistribution layer 505; filling a metal into the opening using an electroplating process, to form the redistribution layer 505 which fills the first opening; and removing the photoresist layer.

Afterward, the main body 511 of the columnar electrode is formed on the surface of the portion of the redistribution layer 505 outside the first opening, and a portion of the seed layer 304 on the passivation layer 503 is removed with the redistribution layer 505 as a mask.

The formation and distribution of the at least one groove in the main body 511, and the formation of the solder ball 510 and the second insulating layer 506 may be similar with the embodiment shown in FIGS. 2 to 14, and are not described in detail here.

Figure 26:
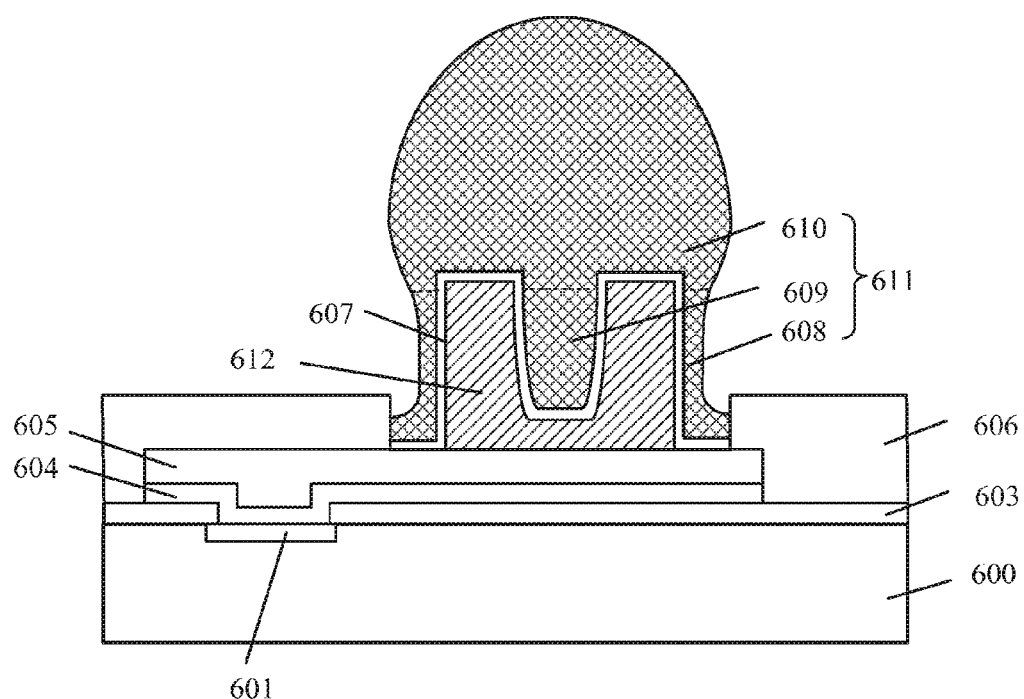
FIG. 26 schematically illustrates a structural diagram of a semiconductor device according to an embodiment of the present disclosure.

Referring to FIG. 26, FIG. 26 schematically illustrates a structural diagram of a semiconductor device according to an embodiment of the present disclosure. The semiconductor device includes: a semiconductor substrate 600 with a pad 601 formed therein; a passivation layer 603 formed on the semiconductor substrate 600, the passivation layer 603 having a first opening which exposes at least a portion of a surface of the pad 601; a seed layer 604 formed on a sidewall and the bottom of the first opening, and on a surface of a portion of the passivation layer 603; a redistribution layer 605 formed on a surface of the seed layer 604, the redistribution layer 605 being filled in the first opening and serving as an extended part of the pad 601; a columnar electrode formed on a surface of a portion of the redistribution layer 605 outside the first opening, wherein the columnar electrode includes a main body 612 and at least one groove in the main body 612, an opening of the groove is overlapped with a top surface of the main body 612 of the columnar electrode; a second insulating layer 606 on the passivation layer 302 and on a portion of the redistribution layer 605, wherein a top surface of the second insulating layer 606 is lower than the top surface of the main body 612, a second annular groove is formed between the second insulating layer 606 and the main body 612; a metal bump 610 formed on the top surface of the main body 612 and a filling part 609 filled in the at least one groove; a margin part 608 surrounding the sidewall of the main body 612, wherein an upper portion of the margin part 608 is connected with the metal bump 610, a lower portion of the margin part 608 is disposed in the second annular groove and connected with a portion of the redistribution layer 605 beside of the columnar electrode, the lower portion has a width greater than that of the upper portion, a surface of the lower portion is lower than, flush with or higher than the top surface of the second insulating layer 606, and the metal bump 610, the filling part 609 and the margin part 608 constitute a solder ball 611; and a metal resist layer 607 between the solder ball 611 and the main body 612, wherein a portion of the metal resist layer 607 is formed on a surface of a portion of the redistribution layer 605 in the second annular groove.

Compared with the embodiment shown in FIGS. 2 to 14, the semiconductor device in the fourth embodiment further has the redistribution layer 605 which serves as an extended part of the pad 601. The columnar electrode is formed on the redistribution layer 605 other than directly on the pad. The redistribution layer 605 can realize the redistribution of contact points, which may improve an integration level of packaged devices.

Forming processes of the above structures may be similar with the embodiment shown in FIGS. 15 to 24 and the embodiment shown in FIG. 25, and are not described in detail here.

In the semiconductor devices provided in the embodiments of the present disclosure, the columnar electrode includes the main body and the at least one groove in the main body, the opening of the at least one groove is overlapped with the top surface of the columnar electrode, and the solder ball is formed on the columnar electrode, and includes the metal bump on the top surface of the columnar electrode and the filling part filled in the at least one groove. In exiting techniques, the solder ball and the columnar electrode are connected with each other at a single plane. However, in the present disclosure, the solder ball and the columnar electrode constitute a bolt like structure. The solder ball and the columnar electrode are connected with each other at multiple planes, that is, the solder ball not only contacts with the top surface of the columnar electrode but also contacts with the inner of the columnar electrode. Thus, a contact area between the solder ball and the columnar electrode is increased, and thus a bonding force between them is improved, which prevents the solder ball from falling off the columnar electrode. Besides, the at least one groove is only disposed in the main body, which does not affect the bonding between the bottom of the main body and the pad.

In some embodiments, there is one groove in the main body, and the diameter of the groove is 1% to 99% of the diameter of the main body. Accordingly, there is one filling part in the solder ball, and the diameter of the filling part is 1% to 99% of the diameter of the main body. A contact area between the filling part and the main body is increased while the mechanical strength of the sidewall of the main body is maintained at a certain level, thus, the bonding force between the solder ball and the columnar electrode is improved, which prevents the solder ball from falling off the columnar electrode.

In some embodiments, there is more than one groove in the main body, which is distributed in the main body independently, for example, in straight line, in matrix, in concentric circle, in concentric ring, in polygon, or irregularly. The number and position of the filling parts correspond to the number and position of the grooves, which increases the number of contact planes between the solder ball and the columnar electrode and further increases the contact area. Thus, the bonding force between the solder ball and the columnar electrode is further improved. The more than one filling part is distributed in the main body regularly, which makes the bonding force between the solder ball and the columnar electrode be distributed evenly in each direction.

In some embodiments, the solder ball further includes the L-shaped margin part surrounding the sidewall of the main body of the columnar electrode. The solder ball not only contacts with the top surface of the main body and the inner sidewall of the groove in the main body, but also contacts with the sidewall of the main body, which further increases the number of contact planes and the contact area between the solder ball and the columnar electrode. When an external force is applied to the solder ball, the external force may be diffused, which can strengthen the bonding between the solder ball and the columnar electrode.

In the methods for forming a semiconductor device provided in the embodiments of the present disclosure, the columnar electrode of the semiconductor device is formed. The columnar electrode includes the main body and the at least one groove in the main body, the opening of the at least one groove is overlapped with the top surface of the columnar electrode, and the solder ball is formed on the columnar electrode, and includes the metal bump on the top surface of the columnar electrode and the filling part filled in the at least one groove. In exiting techniques, the solder ball and the columnar electrode are connected with each other at a single plane. However, in the present disclosure, the solder ball and the columnar electrode constitute a bolt like structure. The solder ball and the columnar electrode are connected with each other at multiple planes, that is, the solder ball not only contacts with the top surface of the columnar electrode but also contacts with the inner of the columnar electrode. Thus, a contact area between the solder ball and the columnar electrode is increased, and a bonding force between them is improved, which prevents the solder ball from falling off the columnar electrode. Besides, the at least one groove is only disposed in the main body, which does not affect the bonding between the bottom of the main body and the pad.

In some embodiments, the depth of the grooves is 0.5% to 99.9% of the height of the main body, so that a contact area between the filling part and the main body is increased, which can strengthen the bonding of a bolt like structure constituted by the solder ball and the columnar electrode.

From the opening to the bottom of the groove, the groove becomes narrower gradually. In this way, gaps are hardly generated when the soldering paste is filled into the groove, which strengthens the connection between the solder ball and the columnar electrode.

Although the present disclosure has been disclosed as above with reference to preferred embodiments thereof but will not be limited thereto. Those skilled in the art can modify and vary the embodiments without departing from the spirit and scope of the present disclosure. Accordingly, without departing from the scope of the present invented technology scheme, whatever simple modification and equivalent variation belong to the protection range of the present invented technology scheme.

What is claimed is:

1. A method for forming a semiconductor device, comprising:
   providing a semiconductor substrate with a pad formed therein;
   forming a passivation layer on the semiconductor substrate, the passivation layer having a first opening which exposes a surface of the pad;
   forming a columnar electrode above the pad, wherein the columnar electrode comprises a main body and at least one groove in the main body, and an opening of the at least one groove is overlapped with a top surface of the columnar electrode; and
   forming a solder ball on the columnar electrode, the solder ball comprising a metal bump formed on the top surface of the columnar electrode and a filling part filled in the at least one groove,
   wherein forming the at least one columnar electrode above the pad comprises:
      forming a seed layer on a sidewall and the bottom of the first opening, and on a surface of the passivation layer;
      forming a first photoresist layer on the seed layer, wherein the first photoresist layer has a second opening which corresponds to the first opening;
      filling a metal into the first and second openings using an electroplating process, to form the main body of the columnar electrode;
   removing the first photoresist layer;
   removing a portion of the seed layer on the passivation layer with the main body as a mask;
   forming a first insulating layer on the passivation layer;
   forming a second photoresist layer on the first insulating layer and on the main body of the columnar electrode, wherein the second photoresist layer has at least one third opening which exposes a top surface of the main body of the columnar electrode; and
   removing a portion of the main body of the columnar electrode by etching along the at least one third opening, to form the at least one groove in the main body, wherein the main body and the at least one groove in the main body constitute the columnar electrode, wherein a top surface of the first insulating layer is flush with the top surface of the main body, and the first insulating layer contacts with a sidewall of the columnar electrode, and wherein forming a solder ball on the columnar electrode removing the second photoresist layer comprises:
      disposing a printing screen or a stainless screen on the first insulating layer, wherein the printing screen or the stainless screen has a fourth opening which exposes the main body and the at least one groove of the columnar electrode;
      filling a soldering paste into the fourth opening and the at least one groove by a screen printing process;
      removing the printing screen or the stainless screen; and
      performing a reflow process on the soldering paste to form the metal bump on the main body of the columnar electrode and the filling part in the at least one groove in the columnar electrode, wherein the metal bump and the filling part constitute the solder ball.

2. The method according to claim 1, wherein one groove is formed in the columnar electrode with a diameter being 1% to 99% of a diameter of the main body of the column electrode.

3. The method according to claim 1, wherein more than one groove is formed in the columnar electrode and distributed in the main body of the columnar electrode independently.

4. A method for forming a semiconductor device, comprising:
   providing a semiconductor substrate with a pad formed therein;
   forming a passivation layer on the semiconductor substrate, the passivation layer having a first opening which exposes a surface of the pad;
   forming a columnar electrode above the pad, wherein the columnar electrode comprises a main body and at least one groove in the main body, and an opening of the at least one groove is overlapped with a top surface of the columnar electrode; and
   forming a solder ball on the columnar electrode, the solder ball comprising a metal bump formed on the top surface of the columnar electrode and a filling part filled in the at least one groove,
   wherein forming the at least one columnar electrode above the pad comprises:
      forming a seed layer on a sidewall and the bottom of the first opening, and on a surface of the passivation layer;
      forming a first photoresist layer on the seed layer, wherein the first photoresist layer has a second opening which corresponds to the first opening;
      filling a metal into the first and second openings using an electroplating process, to form the main body of the columnar electrode;
   removing the first photoresist layer;
   removing a portion of the seed layer on the passivation layer with the main body as a mask;
   forming a first insulating layer on the passivation layer;
   forming a second photoresist layer on the first insulating layer and on the main body of the columnar electrode, wherein the second photoresist layer has at least one third opening which exposes a top surface of the main body of the columnar electrode; and removing a portion of the main body of the columnar electrode by etching along the at least one third opening, to form the at least one groove in the main body, wherein the main body and the at least one groove in the main body constitute the columnar electrode, wherein a top surface of the first insulating layer is lower than the top surface of the main body of the columnar electrode, and a first annular groove is formed between the first insulating layer and the columnar electrode, and exposes a portion of the surface of the passivation layer.

5. The method according to claim 4, further comprising:

after the at least one groove is formed in the main body, removing the second photoresist layer;

disposing a printing screen or a stainless screen on the first insulating layer, wherein the printing screen or the stainless screen has a fifth opening which exposes the top surface of the main body, the at least one groove of the columnar electrode and the first annular groove;

filling a soldering paste into the fifth opening, the at least one groove and the first annular groove by a screen printing process;

removing the printing screen or the stainless screen; and performing a reflow process on the soldering paste to form the metal bump on the main body of the columnar electrode, the filling part in the at least one groove in the columnar electrode, and a margin part surrounding the sidewall of the main body of the columnar electrode, wherein an upper portion of the margin part is connected with the metal bump, a lower portion of the margin part is disposed in the first annular groove and contacts with a portion of the passivation layer beside the columnar electrode, the lower portion is wider than the upper portion, a surface of the lower portion is lower than, flush with or higher than the top surface of the first insulating layer, and the metal bump, the filling part and the margin part constitute one of the solder balls.

6. A method for forming a semiconductor device, comprising:

providing a semiconductor substrate with a pad formed therein;

forming a passivation layer on the semiconductor substrate, the passivation layer having an opening which exposes a surface of the pad;

forming a seed layer on a sidewall and the bottom of the opening, and on a portion of a surface of the passivation layer which is close to the opening;

forming a columnar electrode above the seed layer in the opening, wherein the columnar electrode comprises a main body and at least one groove in the main body, and an opening of the at least one groove is overlapped with a top surface of the columnar electrode;

forming an insulating layer on the passivation layer, the insulating layer exposing the seed layer, wherein an annular groove is formed between the insulating layer and the main body; and filling a soldering paste into the at least one groove in the main body and the annular groove, and onto a top surface of the main body and a sidewall of the main body, to form a solder ball, the solder ball comprising a metal bump formed on the top surface of the columnar electrode and the sidewall of the main body, and a filling part filled in the at least one groove in the main body and the annular groove.

* * * * *